US007715677B2

(12) United States Patent
Helmy

(10) Patent No.: US 7,715,677 B2
(45) Date of Patent: May 11, 2010

(54) APPARATUS AND METHODS FOR ACHIEVING PHASE-MATCHING USING A WAVEGUIDE

(76) Inventor: Amr Helmy, 20 Avoca Avenue, Apt. 1003, Toronto, Ontario (CA) M4T 2B8

(\*) Notice: Subject to any disclaimer, the term of this patent is extended or adjusted under 35 U.S.C. 154(b) by 0 days.

(21) Appl. No.: 11/583,851

(22) Filed: Oct. 20, 2006

(65) Prior Publication Data

US 2007/0104443 A1    May 10, 2007

Related U.S. Application Data

(60) Provisional application No. 60/728,748, filed on Oct. 21, 2005.

(51) Int. Cl.
*G02B 6/10* (2006.01)
(52) U.S. Cl. .................................... 385/131; 385/129
(58) Field of Classification Search ................ 385/131, 385/129, 45; 372/43.01
See application file for complete search history.

(56) References Cited

U.S. PATENT DOCUMENTS

| 5,345,456 | A | \* | 9/1994 | Dai et al. ........................ 372/22 |
| 6,393,185 | B1 | \* | 5/2002 | Deacon ........................ 385/50 |
| 6,829,286 | B1 | \* | 12/2004 | Guilfoyle et al. ............. 372/108 |
| 7,266,284 | B2 | \* | 9/2007 | Weiss et al. .................. 385/147 |
| 2005/0131129 | A1 | \* | 6/2005 | Imaizum et al. ........... 348/222.1 |
| 2006/0039653 | A1 | \* | 2/2006 | Painter et al. ................. 385/50 |

\* cited by examiner

*Primary Examiner*—Ellen Kim

(57) ABSTRACT

The present invention relates to an apparatus and methods for achieving phase-matching between various waves and/or modes by operation of a waveguide. Phase-matching between interacting waves is achieved by total internal reflection and transverse Bragg reflection waveguides. Using second harmonic generation in GaAs/AlGaAs as an example, properties are investigated and quantified such as nonlinear coupling efficiency, bandwidth, tunability, and limitations due to dispersion. The technique is advantageous when compared to alternate technologies, where it is particularly attractive as a material independent means to obtain ultra-low-loss nonlinear optical elements for monolithic integration with coherent light source and other active devices.

21 Claims, 19 Drawing Sheets

APPARATUS AND METHODS FOR ACHIEVING PHASE-MATCHING USING A WAVEGUIDE

This application claims the benefit of U.S. Provisional Application No. 60/728,748, filed Oct. 21, 2005.

BACKGROUND OF INVENTION

Reference to background documents refers to the "List of References" provided below.

The demand on optical devices and technologies in the fields of signal processing, mobile communication technologies, on chip/board data links, aeronautics, aerospace, sensing, life science diagnostics and environmental monitoring is at an all time high. The availability, performance and cost effectiveness of such photonic components has been inadequate at best. This can partially be attributed to the lack of an efficient, compact and tunable nonlinear element in the optics domain in conjunction with a material system with a viable fabrication technology. III-V semiconductors have been widely used in integrated optoelectronic circuits and nonlinear optical applications. Mature growth, lithography and etching technologies allow the fabrication of low-loss guiding structures. The use of electronic-scale heterostructures enables additional control, flexibility and functionality to be incorporated into the devices. The large useable nonlinearities achievable to date in III-V semiconductors chiefly rely on carriers, and have been studied extensively to induce nonlinearities in semiconductor optical amplifiers. The drawbacks of high insertion loss, large size and excessive noise figures are inherently associated with them and hence they will not be suitable for all applications. Most notable applications that would benefit from integrable ultra-fast optical nonlinearities include monolithically integrated optical parametric oscillators (OPOs), correlated photon pair sources and tunable frequency conversion monolithic arrays.

Optical parametric oscillators (OPOs) have become indispensable coherent sources for the mid infrared. Their operating wavelength span is limited by the transparency window of lithium niobate, however, because periodically poled lithium niobate (PPLN) is the most commonly used nonlinear element in OPOs. In contrast, compound semiconductors such as GaAs exhibit higher nonlinear coefficients near the materials resonances in comparison to PPLN, and have a large transparency window. In the case of GaAs, the transparency window scans the spectral range of 1-17 μm. GaAs also has high damage threshold and a mature fabrication technology for making waveguides in comparison to PPLN. Also, large dispersion is also present in this operation regime. This makes the problems of phase-matching quite severe in this common material system. Various means have been devised to overcome this problem; form birefringence, quasi-phase-matching and photonic bandgap devices were all studied. On the other hand these solutions provided devices that can be difficult to be practically integrated with linear photonic devices, or that involves imperfect phase-matching which reduces the attainable effective nonlinearity.

Correlated photon pairs can be generated through the process of parametric down conversion. For example, one photon at 0.775 μm injected into a sample with appropriate phase-matching could generate two correlated photons at 1.55 μm. Achieving this technology provides very compact sources and allows the integration of the pump source on the same chip. This finds applications in fields ranging from metrology, calibration, quantum experiments, to quantum key distribution.

Ultrafast nonlinearities can also enable the realization of integrated arrays of tunable frequency conversion elements. Optical telecommunications networks which imply any form of wavelength diversity in the physical layer could greatly benefit from these devices. The tuning offered by these devices, together with the integration of the pump source on the same chip, provides unprecedented versatility and configurability into the network. Devices with such functionality have been previously demonstrated in $LiNbO_3$ and have been proven very successful in WDM networks. However, monolithically integrated arrays would vastly reduce system complexity, hence cost.

It is clear from the few applications discussed above that achieving efficient, low loss and tunable phase-matching in a semiconductor material is pivotal for the realization of the next generation of photonic devices. The high nonlinear coefficients of semiconductors at photon energies near the band gap are difficult to exploit practically, as the material dispersion is formidable in this spectral region. This makes phase-matching between the fundamental and second harmonic (SH) waves difficult to achieve. Various authors have proposed schemes to overcome this limitation, utilizing form birefringence as per Reference 1, quasi-phase-matching (QPM) through periodic suppression of the nonlinear coefficient [Reference 1] or domain inversion [References 1 and 2], and resonant cavities [Reference 1]. Such methods generally suffer from difficulty in monolithic integration with other active and passive components, or large insertion loss due to scattering.

What is needed is a relatively simple means for achieving phase-matching in compound semiconductor heterostructures. There is a further need for a device that provides phase-matching in a compound semiconductor structure by means of a waveguide.

SUMMARY OF INVENTION

The present invention relates to an apparatus and methods for achieving phase-matching between various waves and/or modes by operation of a waveguide.

In one aspect, the present invention is an apparatus or device for achieving phase-matching using a waveguide.

According to one embodiment, the apparatus of the present invention comprises a core and upper cladding and lower cladding having a periodic structure, wherein the upper cladding and the lower cladding are connected adjacent to and oppositely disposed about the core, and wherein the core, the upper cladding and the lower cladding are operable to guide waves by total internal reflection and by transverse Bragg reflection. For example, the fundamental wavelength is guided by total internal reflection and the second harmonic wavelength is guided by transverse Bragg reflection.

In further aspects, a device in accordance with the present invention is operable to achieve phase-matching wherein: (a) the device is material independent, (b) there is no material perturbation to the unit cell translation matrix formulation, or otherwise in the direction of propagation of the wave, and (c) electrical conductivity is possible in the directions orthogonal to and parallel to the direction of propagation of the wave. The phase-matching device is further operable of guiding a plurality of modes with effective indices lower than a plurality of material indices. The phase-matching device operates without patterning in the direction of propagation, thereby reducing insertion loss.

In another aspect, the present invention is a method for phase-matching comprising directing waves through a waveguide and thereby achieving phase-matching.

According to one embodiment, the method of the present invention comprises: (a) providing a waveguide that includes a core, upper cladding and lower cladding, wherein the upper cladding and the lower cladding have a periodic structure, wherein the materials and dimensions for the upper cladding, lower cladding and the core provide phase-matching, and wherein the upper cladding and the lower cladding are adjacent to and oppositely disposed about the core are connected; and (b) directing waves through the core, whereby the core, the upper cladding and the lower cladding are operable to guide the waves by total internal reflection and by transverse Bragg reflection.

In yet another aspect of the present invention, a phase-matching method is provided for the second order nonlinear optical susceptibility which can then be used to produce frequency conversion, using a waveguide, including but not limited to harmonic generation and frequency shifting.

The phase-matching device of the present invention is demonstrated here through an example where it would be operable to provide second harmonic (SH) generation of a pump at 1550 nm to coherent radiation at 775 mm. Parametric conversion can also be demonstrated using the same structure by launching the SH at 775 nm. Parametric florescence can then be obtained at 1550 nm.

BRIEF DESCRIPTION OF THE DRAWINGS

A detailed description of the preferred embodiment(s) is(are) provided herein below by way of example only and with reference to the following drawings, which are taken from subsequent work to this invention which studied the phenomenon in detail [References 1, 2].

Figure 1:
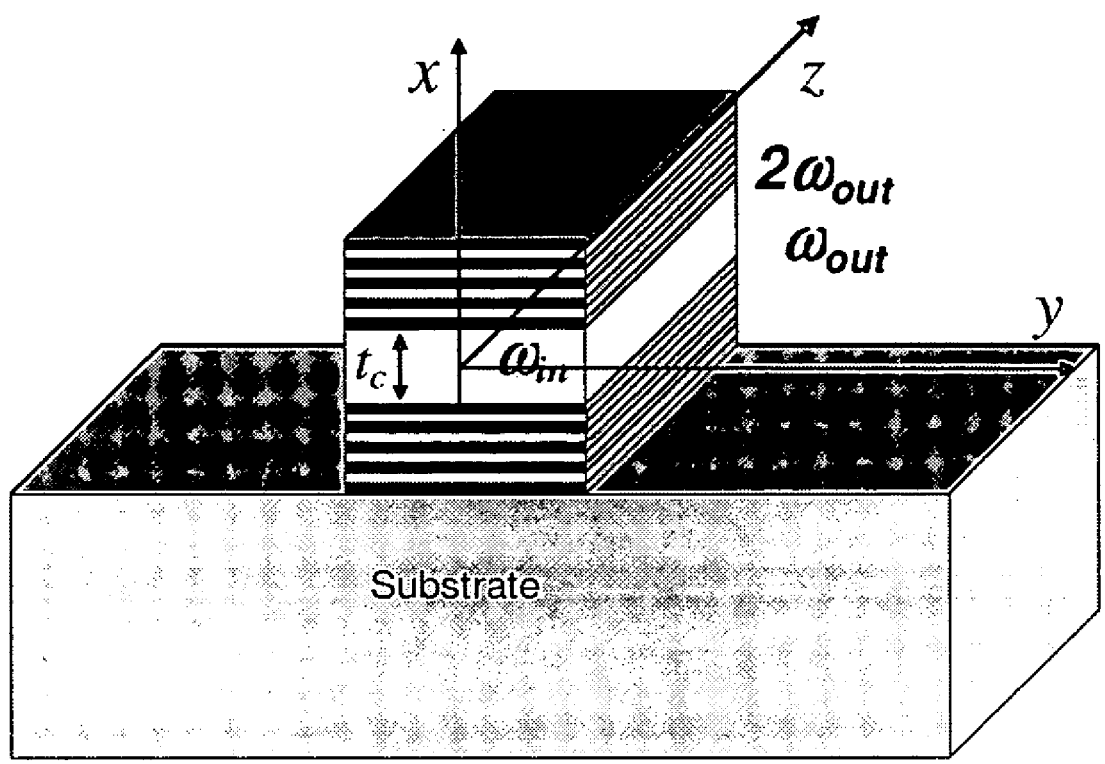
FIG. 1 illustrates a Bragg reflection waveguide in accordance with the present invention for phase-matched second harmonic generation.

In the drawings, preferred embodiments of the invention are illustrated by way of example. It is to be expressly understood that the description and drawings are only for the purpose of illustration and as an aid to understanding, and are not intended as a definition of the limits of the invention.

DETAILED DESCRIPTION OF INVENTION

In the following description, numerous specific details are set forth to provide a thorough understanding of the invention. These details were taken from References 1 and 2 where the idea of the invention has been analyzed and verified in details. However, it is understood that the invention may be practiced without these specific details. In other instances, well-known structures and techniques have not been described or shown detail in order not to obscure the invention.

General Attributes of Waveguide of the Present Invention

Under this heading, the Bragg reflection waveguide (BRW) of the present invention and the solution of its quasi-bound modes is described, with particular attention to the special case of a transverse quarter-wave cladding.

The Bragg Reflection Waveguide (BRW) is known per se and was analyzed by Yariv, Yeh, and Hong [References 3, 4]. While the more common TIR waveguide operates through total internal reflection between a high-index core and lower-index cladding, the BRW of the present invention has no such requirement; rather, it utilizes the stop-band of a transverse distributed Bragg reflector to provide reflection and thus confinement of guided waves, and hence can guide light in a region of any refractive index. The ability to guide light through a low-index core has received significant attention from many authors, particularly in the development of air-core guides for mechanically tunable gratings [Reference 5] and particle acceleration [Reference 6]. The unique birefringence properties of prior art BRWs due to the polarization dependence of the Fresnel coefficients have been utilized to create polarization splitters/combiners [Reference 7]. For nonlinear propagation, BRWs have been shown to support spatial optical solutions [Reference 8], as well as nonlinear guided modes at high optical power in structures that support no linear bound modes [Reference 9].

In the context of phase-matching, the ability of BRWs to support essentially lossless bound modes with effective indices lower than any of the material indices is utilized for the SH wave in accordance with the present invention in order to compensate for material dispersion. Strictly speaking, the BRW of the present invention generally requires an infinite number of cladding periods to have zero loss, but as will be shown below, with proper design suitably low loss can be achieved with just a few periods. As such, the derivations of the BRW in accordance with the present invention described below assume an infinite cladding in order to utilize Bloch-Floquet theory; implications of a finite cladding are particularized below.

Figure 2:
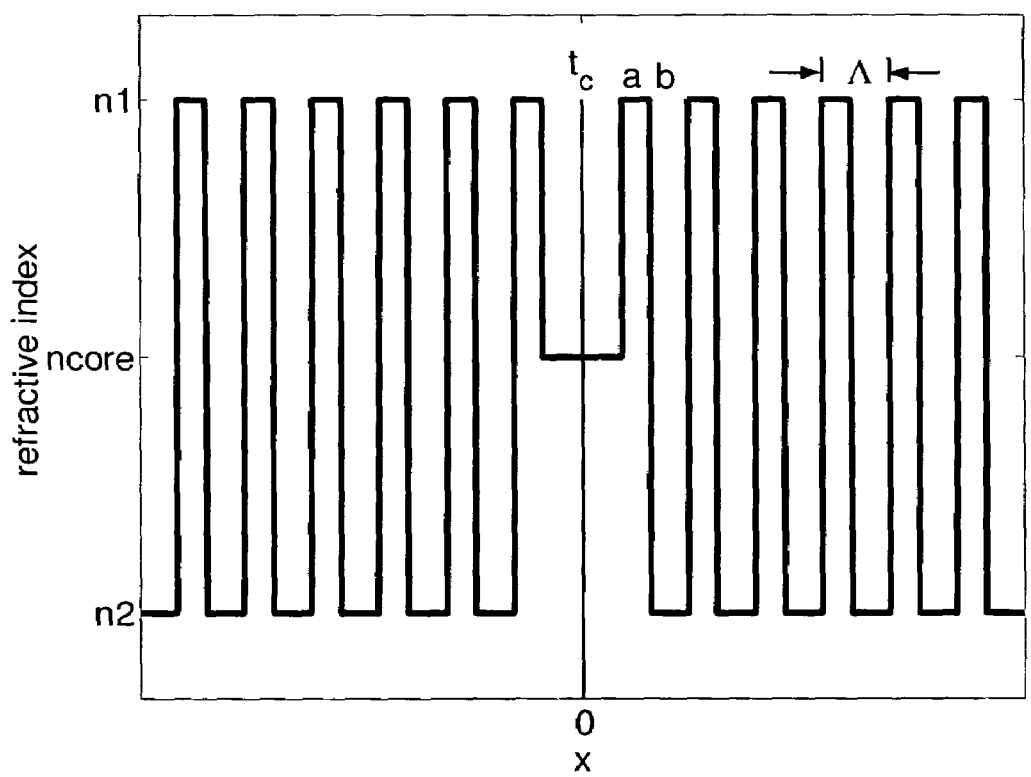
FIG. 2 illustrates a one-dimensional Bragg reflection waveguide with indices and dimensions indicated, in a representative embodiment of the present invention.

The 1-D BRW is shown schematically in FIG. 2, where we follow on from the analysis carried out previously in Reference 15. It consists of a core of thickness $t_c$ and index $n_{core}$, and periodic cladding layers of thickness a ($n_1$) and b ($n_2$). The waveguide is symmetric about x=0, in a particular implementation of the present invention. BRWs in general need not be symmetric, but this restriction eases the design and ensures strong overlap between the guided modes and the core, as further explained below.

It should be understood that a core as discussed herein can be fabricated from any number of materials including air or another simple gas.

At this stage transverse electric (TE) modes are considered in particular for the sake of illustration, in which the electric field vector is parallel to the slab interfaces. Propagation is along z, and we assume that $\partial/\partial y=0$. The electric field can thus be written $$E_y(x,y,z,t)=E(x)e^{i(\omega t-\beta z)} \quad (1)$$

and satisfies the wave equation $$\frac{\partial^2 E(x)}{\partial x^2}+\left(\frac{\omega^2 n^2(x)}{c^2}-\beta^2\right)E(x)=0. \quad (2)$$

We assume a solution of the form $$E(x)=\begin{cases} C_1\cos(k_c x)+C_2\sin(k_c x), & |x|\le \frac{t_c}{2} \text{ (core)}, \\ C_3 E_K\left(|x|-\frac{t_c}{2}\right)e^{iK(|x|-\frac{t_c}{2})}, & |x|>\frac{t_c}{2} \text{ (cladding)}, \end{cases} \quad (3)$$

where the $C_i$ are constants to be determined, $\beta$ is the propagation constant, $k_c$ is the transverse wavevector in the core layer, $$k_c=\sqrt{\left(\frac{\omega n_c}{c}\right)^2-\beta^2}, \quad (4)$$

and K is the Bloch wave vector defined below. $E_K(x)$ is periodic with period $\Lambda$, that is, $$E_K(x+\Lambda)=E_K(x). \quad (5)$$

The assumption of an infinite cladding implies that $\beta$ is real (absorption in the waveguide is presumed negligible here). For the purpose of phase-matching, only even modes are considered for illustration purposes (by parity, odd BRW modes will have zero overlap with the desired even TIR modes, leading to zero SH generation (SHG) efficiency, as shown below). Again, for explanation purposes cladding only in the region x>0 is considered.

The properties of the field in the cladding have been examined extensively by Yeh [Reference 10]. For an infinite periodic stack, the electric field in the $n^{th}$ unit cell (n=0, 1, 2 . . . , where the zeroth unit cell is adjacent to the waveguide core) can be written as $$E(x)=\begin{cases} a_n e^{ik_1(x-\frac{t_c}{2}-n\Lambda)}+b_n e^{-ik_1(x-\frac{t_c}{2}-n\Lambda)}, & n\Lambda \le \left(x-\frac{t_c}{2}\right)\le n\Lambda+a, \\ c_n e^{ik_2(x-\frac{t_c}{2}-n\Lambda-a)}+d_n e^{-ik_2(x-\frac{t_c}{2}-n\Lambda-a)}, & n\Lambda+a \le \left(x-\frac{t_c}{2}\right)\le (n+1)\Lambda, \end{cases} \quad (6)$$

where the amplitudes of incoming and outgoing waves are related between adjacent unit cells by a translation matrix, $$\begin{pmatrix} a_{n-1} \\ b_{n-1} \end{pmatrix}=\begin{pmatrix} A & B \\ C & D \end{pmatrix}\begin{pmatrix} a_n \\ b_n \end{pmatrix}. \quad (7)$$

In (7), the matrix elements are $$A=e^{ik_1 a}\left[\cos k_2 b+\frac{i}{2}\left(\frac{k_2}{k_1}+\frac{k_1}{k_2}\right)\sin k_2 b\right], \quad (8)$$

$$B=e^{-ik_1 a}\left[\frac{i}{2}\left(\frac{k_2}{k_1}-\frac{k_1}{k_2}\right)\sin k_2 b\right],$$

$$C=B^*, D=A^*,$$

where $k_1$, $k_2$ are transverse wavevectors in cladding layers with index $n_1$ and $n_2$ respectively, defined analogously to $k_c$.

The periodicity of $E_K(x)$ can be imposed by writing $$\begin{pmatrix} a_{n-1} \\ b_{n-1} \end{pmatrix}=e^{iK\Lambda}\begin{pmatrix} a_n \\ b_n \end{pmatrix}, \quad (9)$$

which, by (7), leads to the eigenvalue problem $$\begin{pmatrix} A & B \\ C & D \end{pmatrix}\begin{pmatrix} a_n \\ b_n \end{pmatrix}=e^{iK\Lambda}\begin{pmatrix} a_n \\ b_n \end{pmatrix}. \quad (10)$$

Using (8), the eigenvalues are given by $$e^{iK\Lambda}=Re(A)\pm\sqrt{[Re(A)]^2-1}, \quad (11)$$

With corresponding eigenvectors $$\begin{pmatrix} a_n \\ b_n \end{pmatrix}=\begin{pmatrix} B \\ e^{iK\Lambda}-A \end{pmatrix}=e^{-inK\Lambda}\begin{pmatrix} a_0 \\ b_0 \end{pmatrix} \quad (12)$$

multiplied by any arbitrary constant (which will hereafter be included in $C_3$). Finally, inserting (12) into (6), $$E(x) = \qquad (13)$$

$$\begin{cases} \left[a_0 e^{ik_1\left(x-\frac{t_c}{2}-n\Lambda\right)} + b_0 e^{-ik_1\left(x-\frac{t_c}{2}-n\Lambda\right)}\right]e^{inK\Lambda}, & n\Lambda \le \left(x-\frac{t_c}{2}\right) \le n\Lambda + a, \text{ where } c_0 \\ \left[c_0 e^{ik_2\left(x-\frac{t_c}{2}-n\Lambda-a\right)} + d_0 e^{-ik_2\left(x-\frac{t_c}{2}-n\Lambda-a\right)}\right]e^{inK\Lambda}, & n\Lambda + a \le \left(x-\frac{t_c}{2}\right) \le (n+1)\Lambda, \text{ and} \end{cases}$$

$d_0$ are obtained as shown in appendix A. From (11), it can be seen that $$K = \frac{1}{\Lambda}\cos^{-1}[\text{Re}(A)]. \qquad (14)$$

When $|\text{Re}(A)|>1$, $K=m\pi/\Lambda+iK_i$, where $m=1, 2, \ldots$ indicates the order of Bragg reflection. By (13), this shows that the field in the cladding is evanescent, which is a requirement for waveguiding.

To solve for the guided TE modes, we enforce continuity of $E(x)$ and $\partial E(x)/\partial x$ at the core/cladding boundary ($x=t_c/2$). This leads to the mode dispersion equation $$k_c \tan\left(\frac{k_c t_c}{2}\right) = ik_1 \frac{e^{iK\Lambda} - A - B}{e^{iK\Lambda} - A + B}, \qquad (15)$$

which can be solved numerically for $\beta$.

As stated above, one of the aspects of the present invention is the material independence of the waveguide. By "material independence" what is meant is that the design versatility that is presented by the BRW waveguide of the present invention permits compensation for any discrepancy for the propagation constant of the interacting waves due to dispersion or otherwise, as further explained below. Therefore, regardless of the effects involved, be it birefringence, dispersion or otherwise, the present invention permits implementation of the waveguide of the present invention in disparate material systems with a set of materials with varying refractive indices. This provides significant advantages in implementations such as in connection with lasers in Si where the phase-matching can be used to achieve nonlinear gain and hence optical parametric oscillators in Si for electronic applications and otherwise. The material independence also provides versatility to engineer and implement phase-matching in any crystalline material or otherwise.

A. Quarter-Wave Bragg Reflection Waveguides

As has been analyzed in Reference 1, for sake of understanding invention, the case is considered where each layer of the cladding has quarter-wave optical thickness with respect to the transverse wavevectors $k_i$, i.e. $k_1 a = k_2 b = \pi/2$. This constraint places the Bloch wave number K in the middle of the Bragg stop-band, thus ensuring strong guiding through maximizing the field decay in the claddings. The unit cell translation matrix elements (7) then reduce to $$A = D = -\frac{1}{2}\left(\frac{k_2}{k_1} + \frac{k_1}{k_2}\right), B = C = \frac{1}{2}\left(\frac{k_2}{k_1} - \frac{k_1}{k_2}\right). \qquad (16)$$

Inserting (16) into (15) gives $$k_c \tan\left(\frac{k_c t_c}{2}\right) = ik_1 \frac{e^{iK\Lambda} + k_1/k_2}{e^{iK\Lambda} + k_2/k_1}. \qquad (17)$$

From (14), $$K\Lambda = m\pi - i\ln\left(\frac{k_2}{k_1}\right), \qquad (18)$$

and for a first-order grating, $m=1$ and the matrix eigenvalue becomes $$e^{iK\Lambda} = e^{i\pi}e^{\ln(k_2/k_1)} = -\frac{k_2}{k_1}. \qquad (19)$$

Inserting (19) into (17) shows that guided modes occur when $$\frac{k_c d_c}{2} = \frac{(p+1)\pi}{2}, p = 0, 2, 4, \ldots \qquad (20)$$

where p is the mode order for even modes. By (20), it can be seen that the electric field has a null at the core/cladding boundary where $|x|=t_c/2$. This result is supported by observing that the transverse field is encountering an external reflection at a perfect quarter-wave stack of infinite periods, for which the reflection coefficient $r=-1$. The sum of outgoing and incoming fields therefore equals zero at the interface, a condition referred to in the literature as a "metallic-like" boundary [Reference 11]. We will concern ourselves with only the fundamental even BRW mode for the remainder of the present disclosure, for which p=0. In this case, $$k_c = \frac{\pi}{t_c} = \frac{2\pi}{\lambda}\sqrt{n_c^2 - n_{\text{eff}}^2}, \text{ and thus} \qquad (21)$$

$$n_{\text{eff}} \sqrt{n_c^2 - \left(\frac{\lambda}{2t_c}\right)^2}. \qquad (22)$$

From (22), it is shown that the waveguide of the present invention is operable to have an arbitrary effective index simply by adjusting the core thickness. It must be noted however that the effective index cannot exceed the index of the cladding material. If this condition is violated, the field will be evanescent in this material, and quarter-wave thickness cannot be achieved [as explained in Reference 12]. In addition, (22) is only valid when the argument of the square root is positive. For $n_2<n_c<n_1$, these conditions constrain the guide width to $$\frac{\lambda}{2n_c} < t_c < \frac{\lambda}{2\sqrt{n_c^2 - n_2^2}}. \quad (23)$$

The refractive indices of GaAs/AlGaAs structures for the SH are larger than those for the fundamental wave because the SH energy is closer to the material bandgap. Therefore the waveguide of the present invention compensates for this difference by providing a modal index for the SH that is much reduced in comparison to the highest refractive index material available in the waveguide structure. The design of the waveguide of the present invention (as shown in FIG. 1) includes an upper and lower cladding with periodic refractive index. For the sake of clarity, the waveguiding at the SH is not based on total internal reflection, instead the mode is guided by the distributed Bragg reflection of the periodic structure. The periodic structures of the claddings are also designed to provide a single mode waveguide based on total internal reflection at the fundamental, as can be seen from the refractive index profiles at both wavelengths as depicted in FIGS. 1 and 2. The mode of the fundamental at 1550 nm is spatially centered in the core of the structure overlapping with the distributed Bragg reflector (DBR)-based mode that SH which is at 775 nm. It should be understood that the refractive index of the core, which is the guiding layer for the SH, has a refractive index lower than that of the claddings.

The periodic claddings and the low refractive index core of the waveguide of the present invention, in a representative embodiment thereof, is operable to guide the SH mode at the 775 nm, while the high refractive index of the first period of the periodic claddings is operable to provide a high index core to act as a single mode at 1550 nm. Because waveguiding is not based on total internal reflection at the SH (775 nm), the probability of having higher order DBR modes satisfying the guiding condition is very low. The thickness of the periodic claddings has to act as a set of quarter wave plates for the x-component of the electric field, and hence $$d_{core} \times k_x = \pi/2$$

$$k_x = \exists \beta^2 - k_z^2$$

$d_{core}$ is the core thickness

The design offers distinct advantages over the techniques which have been developed previously:

Gain can be provided in structures through carrier injection. The electrical pumping is readily available in such structures due to the work which has been carried out developing VCSELs.

Voltage can be applied to the structure to provide phase-matching tunability for the SHG process, as further particularized below.

Launching the second harmonic and fundamental into these waveguides is relatively straight forward since the modes involved are the only vertical modes available. The total internal reflection waveguide at the fundamental is designed with a single mode and the Bragg reflection waveguide has low probability of exciting any higher order modes in the vertical direction, since the resonant condition is likely to be achieved for other wavelengths.

The waveguide of the present invention is not based on patterning along the direction of propagation and hence have the potential to possess low optical losses in comparison with other quasi-phase-matching designs. Also, no excessive roughness is expected since the structures are all epitaxially grown in comparison with other designs which involve oxidation for form birefringence, where substantial scattering can be present.

Figure 3:
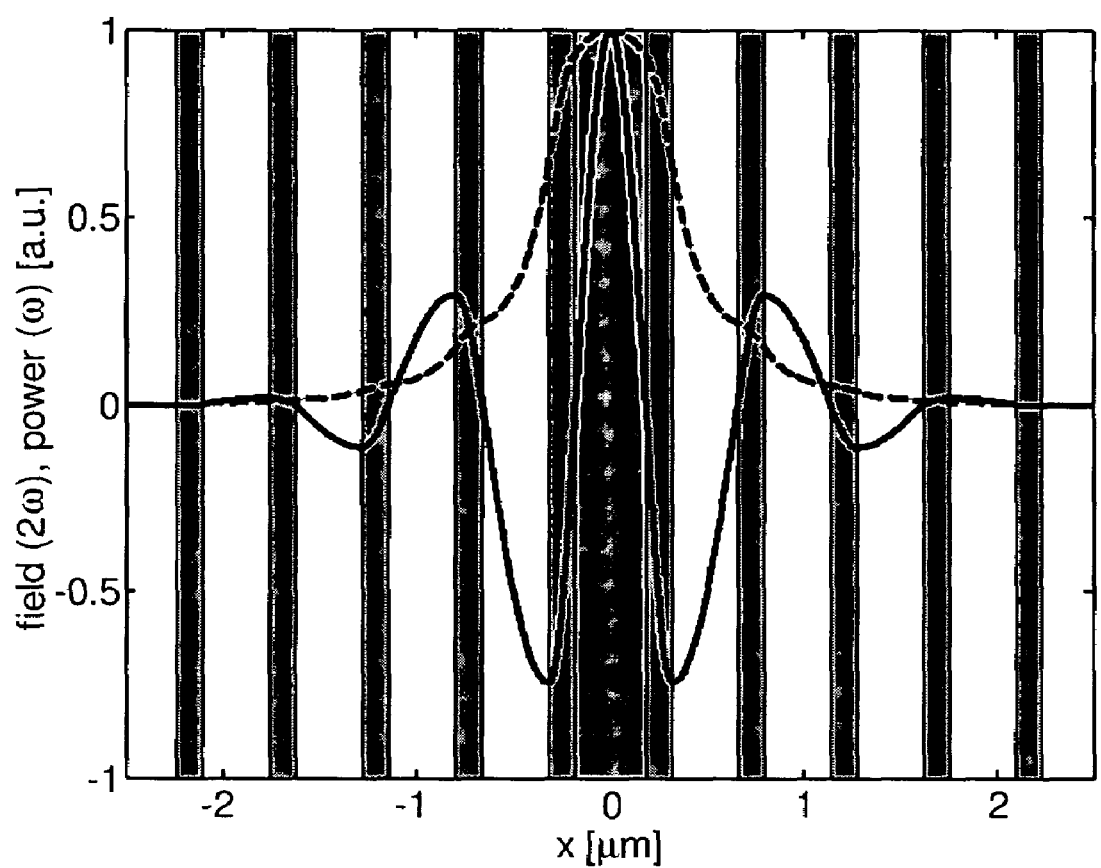
FIG. 3 illustrates a solid field profile of SH mode, and (dashed) power profile of phase-matched fundamental TIR mode in a Bragg reflection waveguide that is quarter-wave at the SH wavelength.

FIG. 3 shows the field profile of a quarter-wave Bragg mode at the SH frequency, and the power profile in the TIR mode at the fundamental frequency. FIG. 3 is better understood by reference to the section entitled "Non-linear Coupling Efficiency".

Now that we have an analytical form for calculating the effective index of the BRW mode, we need to be able to solve it simultaneously with that of the TIR mode within the same waveguide at one-half of the photon energy. This will be developed in the following section.

Phase-Matched Mode

Under this heading it is illustrated how the waveguide of the present invention is operable in the BRW mode at the SH wavelength to be phase-matched with the TIR mode at the fundamental wavelength for arbitrary core and cladding materials.

Figure 4:
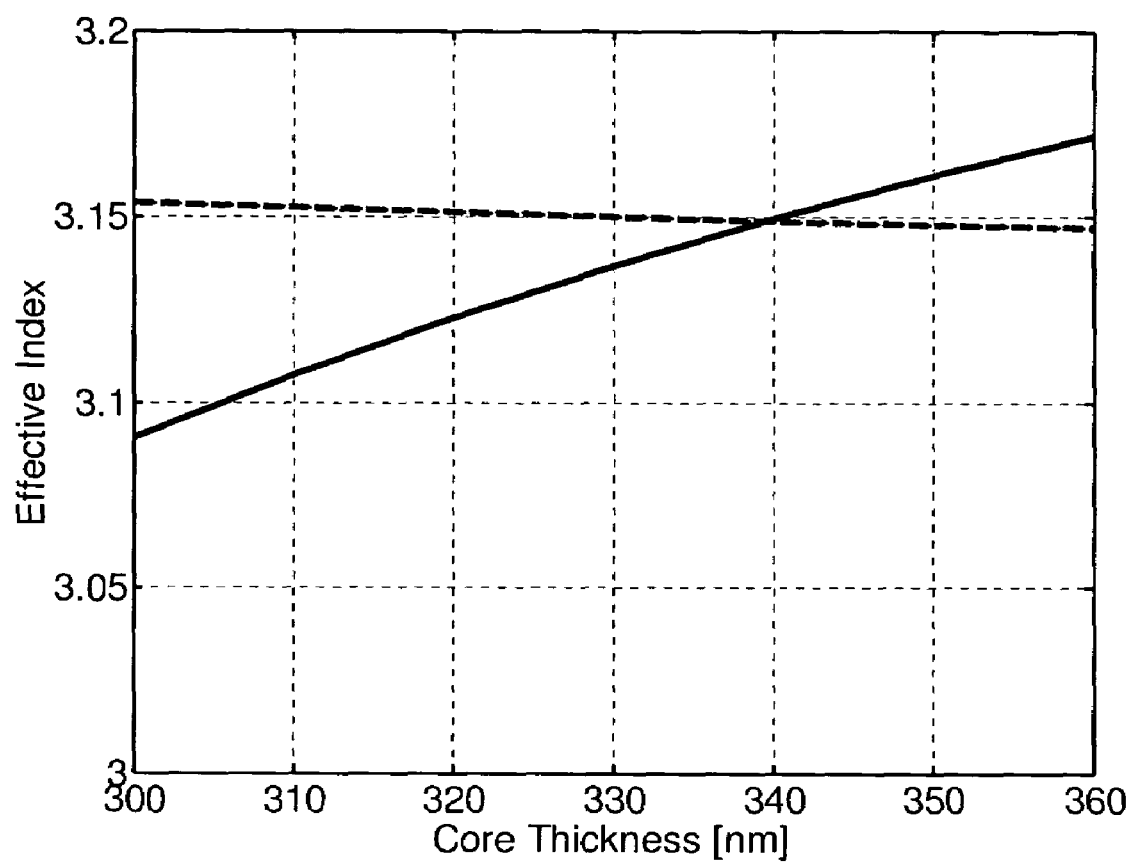
FIG. 4 illustrates effective index. vs. core thickness for a waveguide with $\{x_1, x_2, x_{core}\}=\{0.3, 0.5, 0.4\}$ (solid line indicates BRW mode and dashed line indicates TIR mode; phase matching occurs where the curves cross; cladding layer thicknesses are determined by the quarter-wave condition of the BRW mode).

A mode dispersion equation (15) for the BRW was provided above. The attributes of the waveguide of the-present invention are explained under this heading that enabling matching of the effective indices of a quarter-wave BRW (QW-BRW) mode at the SH frequency ($2\omega$) with a TIR mode at the fundamental frequency ($\omega$) when the core and cladding materials are known, by a suitable choice of core thickness, as shown in FIG. 4. Note that the cladding thicknesses are implicitly variable—they will be determined from the resulting effective index using the quarter-wave condition. In actuality, the TIR mode is confined by the Bragg reflection in the cladding as well as internal reflection at the cladding interfaces ($n_{eff} > n_2^\omega$), so the waveguide can still be modeled using eqns. (3)-(15).

In all equations below, the superscripts indicate which frequency ($\omega$ or $2\omega$) is under consideration. Values that are identical for both frequencies (a, b, and $n_{eff}$) are not superscripted. We begin by expressing (22) in terms of frequency, $$n_{eff} = \sqrt{(n_c^{2\omega})^2 - \left(\frac{\pi c}{2\omega t_c}\right)^2}. \quad (24)$$

Cladding layer thicknesses a and b are determined by the quarter-wave condition at $2\omega$, $$a = \frac{\pi}{2k_1^{2\omega}} = \frac{\pi c}{4\omega}\left((n_1^{2\omega})^2 - n_{eff}^2\right)^{-1/2} \quad (25)$$

$$b = \frac{\pi}{2k_2^{2\omega}} = \frac{\pi c}{4\omega}\left((n_2^{2\omega})^2 - n_{eff}^2\right)^{-1/2}, \quad (26)$$

and transverse propagation vectors at $\omega$ are determined as $$k_c^\omega = \frac{\omega}{c}\sqrt{(n_c^\omega)^2 - n_{eff}^2} \quad (27)$$

$$k_1^\omega = \frac{\omega}{c}\sqrt{(n_1^\omega)^2 - n_{eff}^2} \quad (28)$$

$$k_2^\omega = \frac{\omega}{c}\sqrt{(n_2^\omega)^2 - n_{eff}^2}, \quad (29)$$

where, for a TIR guide, $k^2_\omega$ is imaginary. Unit cell translation matrix elements at $\omega$ are as in (8), $$A^\omega = e^{ik_1^\omega a}\left[\cos k_2^\omega b + \frac{i}{2}\left(\frac{k_2^\omega}{k_1^\omega} + \frac{k_1^\omega}{k_2^\omega}\right)\sin k_2^\omega b\right] \quad (30)$$

$$B^\omega = e^{-ik_1^\omega a}\left[\frac{i}{2}\left(\frac{k_2^\omega}{k_1^\omega} - \frac{k_1^\omega}{k_2^\omega}\right)\sin k_2^\omega b\right], \quad (31)$$

and the translation matrix eigenvalue is $$\exp(iK^\omega\Lambda) = \exp(i\cos^{-1}[Re\{A^\omega\}]). \quad (32)$$

Finally, as the waveguide must satisfy the mode dispersion equation at $\omega$, $$-k_c^\omega\tan\left(\frac{k_c^\omega t_c}{2}\right) + ik_1^\omega \frac{e^{iK^\omega\Lambda} - A^\omega - B^\omega}{e^{iK^\omega\Lambda} - A^\omega + B^\omega} = F(\omega,\beta) = 0. \quad (33)$$

Note that (33) depends only on the core thickness, via (24)-(32). Since $t_c$ is a real quantity, (33) can easily be solved using numerical root-finding methods.

A. EXAMPLES

Examples which have been published in References 1 and 2 are given here to further clarify the invention. In a representative embodiment of the waveguide of the present invention the GaAs/Al$_x$Ga$_{1-x}$As material system is used, which has been studied extensively for frequency conversion due to its mature fabrication technology and large nonlinear coefficient at the half bandgap [e.g., Reference 13]. To calculate material indices, the refractive index dispersion model of Adachi was used [Reference 14]. FIG. 5($a$) shows contours of the phase-matching core thickness for a fundamental wavelength of 1550 nm, over a range of core and cladding Al concentrations. The Al fraction in the cladding layers is initially chosen to be symmetric about that of the core, i.e. $x_{clad} = x_{core} \pm \Delta x_{clad}/2$. Al fractions $x_{core}$ and $\Delta x_{clad}$ are used instead of material indices $n_{core}$ and $\Delta n_{clad}$ as the latter are variable due to material dispersion between the fundamental and SH wavelengths. Note that the range of $x_{clad}$ and $\Delta x_{clad}$ are chosen such that $0.15 \leq x \leq 1$, to ensure that the SH photon energy exceeds the bandgap energy of Al$_x$Ga$_{1-x}$As. FIG. 5($b$) shows contours of the phase-matched effective indices. The calculated effective indices were verified by solving the waveguides using the well-known transfer matrix method [15], which makes no a priori assumption on the waveguiding mechanism (BRW or TIR).

FIGS. 5($a$) and 5($b$) demonstrate that phase-matched solutions exist over a wide range of core and cladding materials by operation of the waveguide of the present invention, subject to the constraint (23). This shows that other properties of the waveguide such as SHG conversion efficiency and dispersion can be optimized in a manner that is known to those skilled in the art, as further particularized under the next heading. Of course, $x_{core}$ need not be at the midpoint of $x_{clad}$. The relative aluminum fractions among the core and cladding all represent degrees of freedom by which the waveguide properties can be optimized.

Waveguide Properties with Respect to Phase-Matching

The properties given here are also taken from References 1 and 2, where this work has been analyzed in details. Under this heading, the important properties of the waveguide of the present invention such as dispersion and nonlinear coupling coefficient are described.

Although qualitatively the simultaneous solution by the waveguide of the present invention of both modes to achieve phase-matching has been shown under the previous heading, issues such as dispersion of the fundamental and SH modes, and phase reversal of the BRW mode, etc., would all reduce the overall conversion efficiency. It is desirable for this reason to optimize the waveguide for these matters. Under the present heading the attributes of an optimized waveguide of the present invention are described.

A. Nonlinear Coupling Efficiency

The efficiency with which energy is coupled between the modes depends on the spatial overlap between the induced dielectric polarization at $2\omega$, $P^{2\omega}(x) = \epsilon_0 d(x)[E^\omega(x)]^2$, and the SH mode, $E^{2\omega}(x)$, where $\epsilon_0$ is the free-space permittivity. We can thus define a nonlinear coupling efficiency $\eta$ which is inversely proportional to $(n_{eff})^3$ and to an effective SHG width [Reference 16], $$\eta = n_{eff}^{-3}\frac{1}{t_{SHG}^{eff}}n_{eff}^{-3}\frac{\left[\int_{-\infty}^\infty [E^{2\omega}(x)]^* d'(x)[E^\omega(x)]^2 dx\right]^2}{[\int_{-\infty}^\infty [E^\omega(x)]^2 dx]^2[\int_{-\infty}^\infty [E^{2\omega}(x)]^2 dx]}, \quad (34)$$

where $d'(x) = d(x)/d_{max}$ is the SHG coefficient, constant across each layer of the waveguide, and $d_{max}$ is the maximum SHG coefficient in the structure. The higher effective indices of GaAs waveguides in comparison to LiNbO$_3$ are more than compensated for by the difference in nonlinear optic coefficient. A geometry-independent figure of merit to compare SHG in two materials is $d^2/(n_{eff})^3$ [Reference 17]. Using $d_{14(AlGaAs)} = 150$ pm/V, $d_{33(LiNbO3)} = 32.2$ pm/V [18], $n_{LiNbO3} = 2.25$, and the effective indices for the GaAs waveguides shown in FIG. 5($b$), it is seen that GaAs is roughly 8.25 times more efficient than LiNbO$_3$ for identical effective SHG widths. It should be noted however that there is still a great deal of discrepancy in the literature as to the absolute value of the nonlinear coefficient of AlGaAs, particularly as a function of Al fraction and close to the half bandgap.

If the fundamental and SH modes are normalized above, the denominator of (34) is equal to one, and efficiency is given by $$\eta = n_{eff}^{-3}(I_c + I_1 + I_2), \quad (35)$$

where the $I_j$ are contributions from the regions with index $n_{core}$, $n_1$, and $n_2$, respectively, which from (13) are:

$$I_c = 2d_{core}(C_1^{2\omega}) * (C_1^\omega)^2 \quad (36)$$
$$\left\{\frac{1}{k_c^{2\omega}} + \frac{t_c}{2}\left[\mathrm{sinc}\left[\frac{(k_c^{2\omega}+2k_c^\omega)t_c}{2\pi}\right] + \mathrm{sinc}\left[\frac{(k_c^{2\omega}-2k_c^\omega)t_c}{2\pi}\right]\right]\right\},$$

$$I_1 = \frac{2d_1(C_3^{2\omega})*(C_3^\omega)^2 a_0^{2\omega}a}{1 - e^{-i(K^{2\omega})^*-2K^\omega)\Lambda}} \quad (37)$$
$$\left\{\mathrm{sinc}\left[\frac{(k_1^{2\omega}+2k_1^\omega)a}{2\pi}\right]\left[\begin{array}{c}(b_0^\omega)^2 e^{-i(k_1^{2\omega}+2k_1^\omega)a/2} - \\ (a_0^\omega)^2 e^{i(k_1^{2\omega}+2k_1^\omega)a/2}\end{array}\right] \times +\sin\right.$$
$$\left.c\left[\frac{(k_1^{2\omega}-2k_1^\omega)a}{2\pi}\right]\left[\begin{array}{c}(a_0^\omega)^2 e^{-i(k_1^{2\omega}-2k_1^\omega)a/2} - \\ (b_0^\omega)^2 e^{i(k_1^{2\omega}-2k_1^\omega)a/2}\end{array}\right] - \frac{8ia_0^\omega b_0^\omega}{\pi}\right\},$$

-continued $$I_2 = \frac{-2d_2(C_3^{2\omega})*(C_3^{\omega})^2 c_0^{2\omega} b}{1 - e^{-i|(K^{2\omega})^* - 2K^\omega|\Lambda}} \quad (38)$$

$$\left\{ \text{sinc}\left[\frac{(k_2^{2\omega} + 2k_2^\omega)b}{2\pi}\right] \left[ \begin{array}{l} (c_0^\omega)^2 e^{i(k_2^{2\omega} + 2k_2^\omega)b/2} + \\ (d_0^\omega)^2 e^{-i(k_2^{2\omega} + 2k_2^\omega)b/2} \end{array} \right] \times + \sin \right.$$

$$\left. c\left[\frac{(k_2^{2\omega} - 2k_2^\omega)b}{2\pi}\right] \left[ \begin{array}{l} (c_0^\omega)^2 e^{-i(k_2^{2\omega} + 2k_2^\omega)b/2} - \\ (d_0^\omega)^2 e^{i(k_2^{2\omega} + 2k_2^\omega)b/2} \end{array} \right] - \frac{8c_0^\omega d_0^\omega}{\pi} \right\}.$$

Figure 5A:
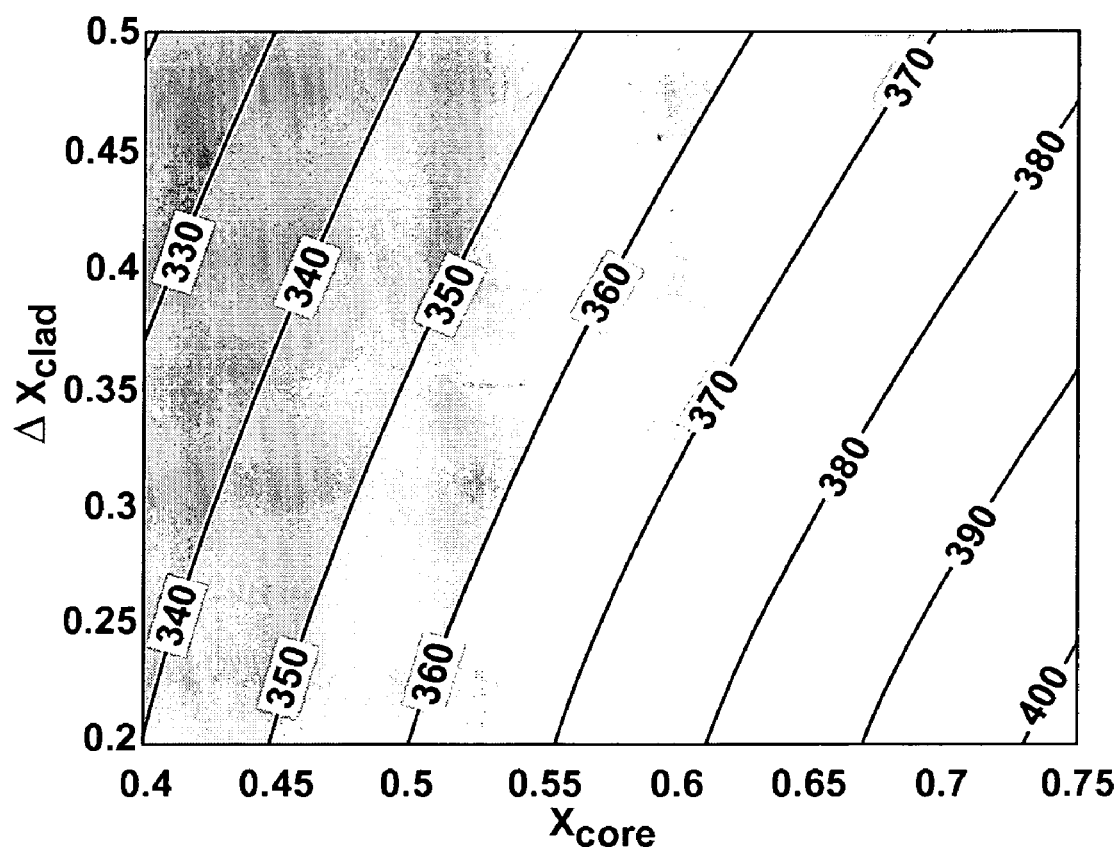
FIG. 5 illustrates core thickness [nm] required for phase-matching (a), and the resulting phase-matched effective index over a range of $x_{core}$ and $\Delta x_{clad}$ ($x_{clad}$ symmetric about $x_{core}$) (b).
Figure 5B:
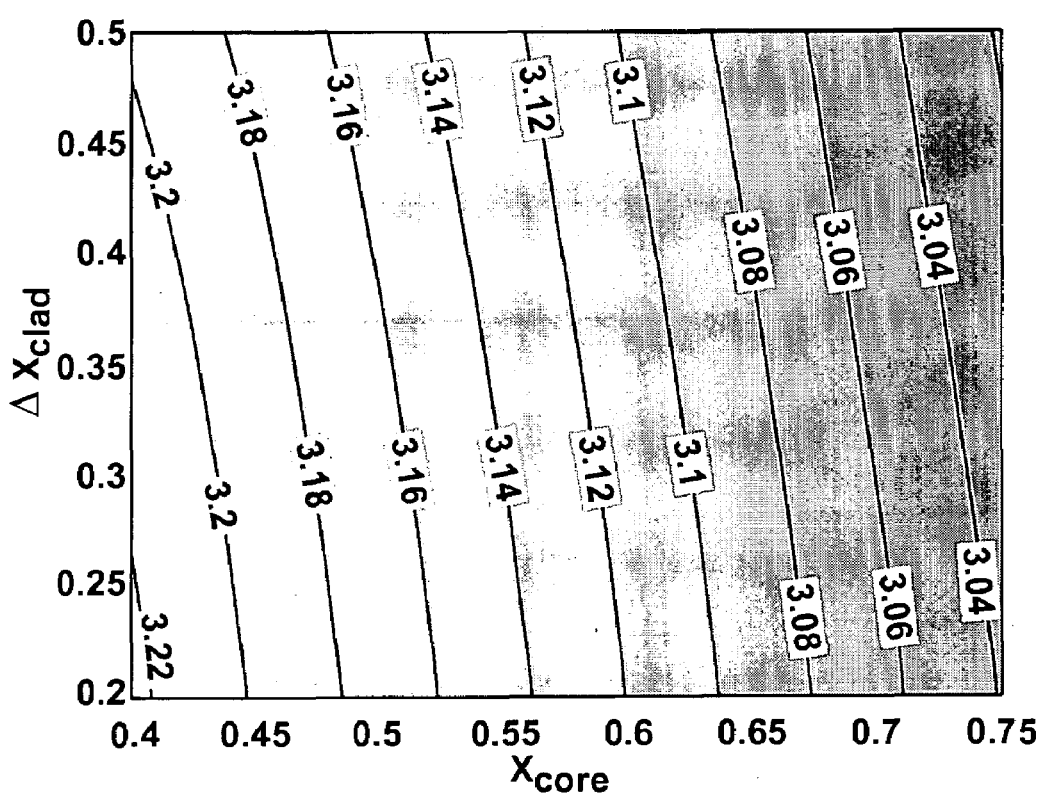
Figure 6A:
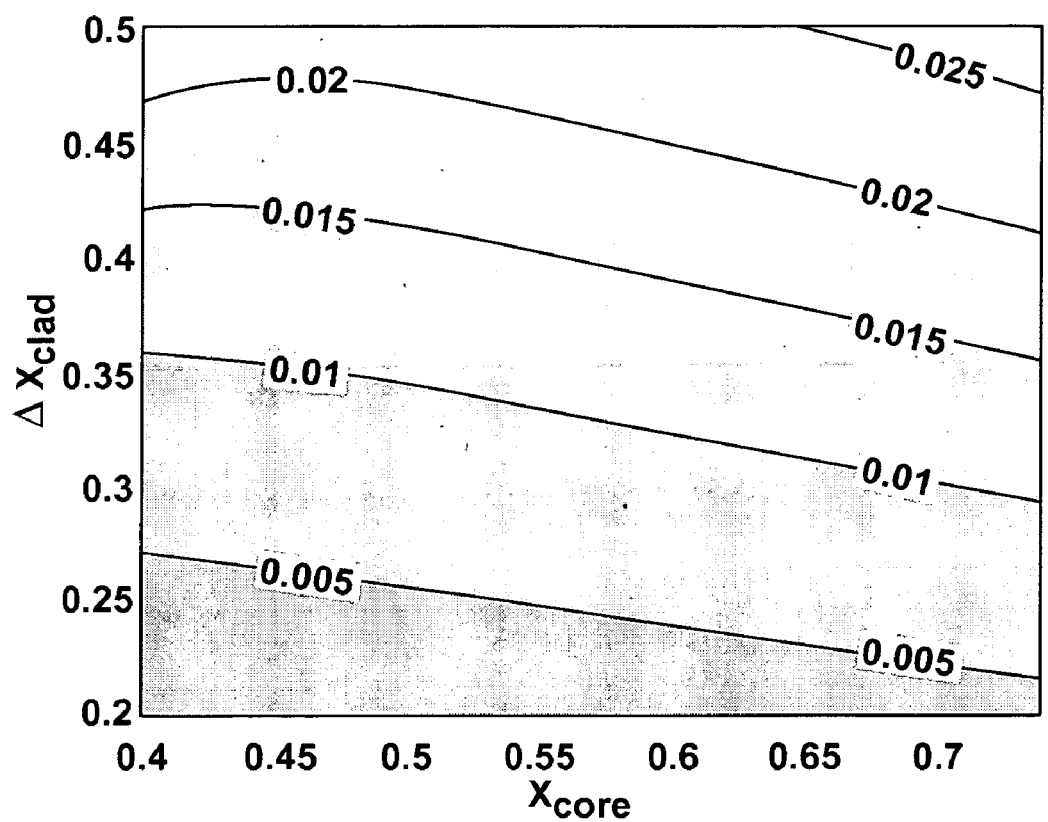
FIG. 6 illustrates (a) $(n_{eff})^{-3}(t_{eff})^{-1}$ [$\mu m^{-1}$] over a range of $x_{core}$ and $\Delta x_{clad}$ ($x_{clad}$ symmetric about $x_{core}$), and (b) $(n_{eff})^{-3}(t_{eff})^{-1}$ [$\mu m^{-1}$] over a range of $x_{core}$ and $x_2-x_{core}$.
Figure 6B:
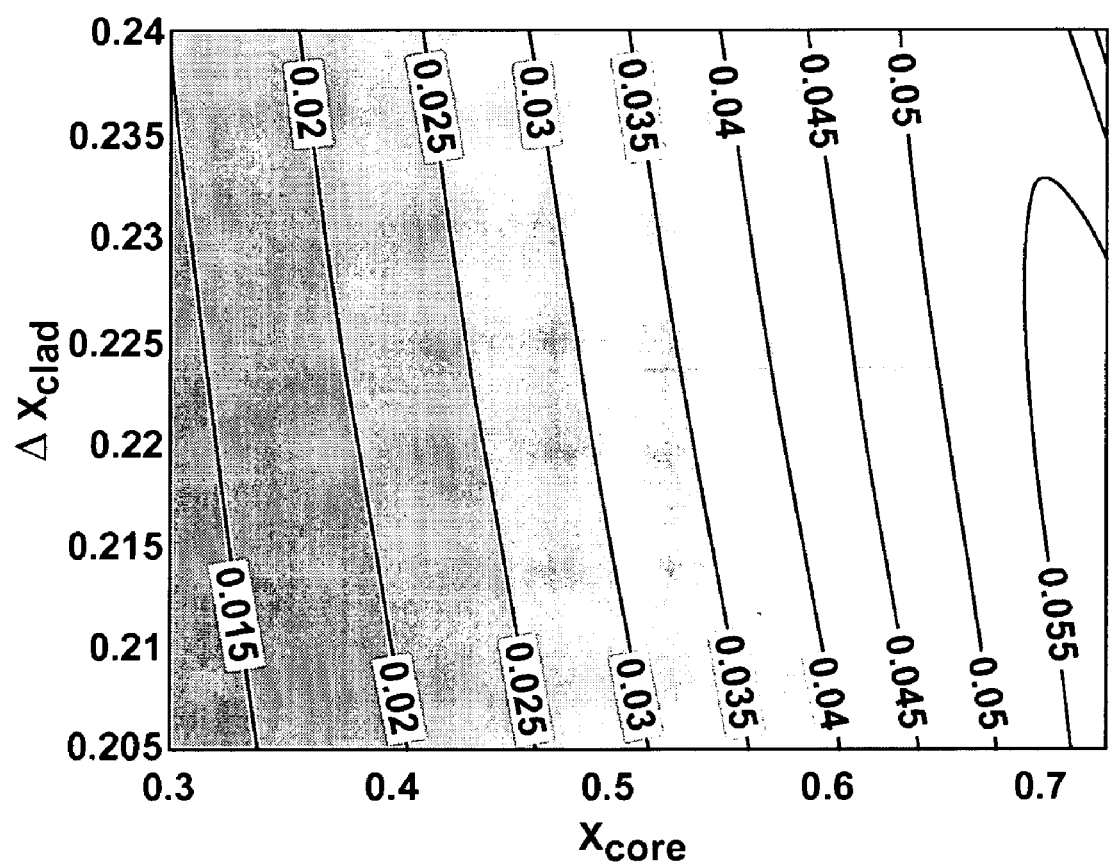

Contours of η, corresponding to the same waveguide structures as in FIG. 5(a), are shown in FIG. 6(a). It is assumed here that d is approximately equal in all regions of the guide, i.e. d'(x)=1. FIG. 6(a) indicates that the coupling coefficient can be increased by using large values of $\Delta x_{clad}$. This can be explained by the oscillation of the SH mode phase in the cladding as can be seen in FIG. 3. For the efficiency to be maximized, one means is to maximize the core confinement factor of both modes, which by (19) requires a large index difference in the cladding. In FIG. 6(b), $x_1$ is set to 0.15, while $x_{core}$ and $x_2-x_{core}$ are varied. A significant increase in η can be seen for larger values of $x_{core}$ (lower core index). The optimized value of η≈0.05 is very similar to that obtained in a $TE_0^\omega-TE_2^{2\omega}$ mode dispersion phase-matching configuration (normalized by effective index) in [Reference 16]. The efficiency can be further maximized by various means, given the versatility afforded by the BRW. Instructions for maximizing the efficiency are discussed below.

B. Dispersion

The wavelength dependence of effective index is of great importance in SHG. Waveguides that are phase-matched at a nominal wavelength, but for which the dispersion differs between the fundamental and SH wavelengths, will maintain coherence over a finite spectral bandwidth. Furthermore, when ultra-short pulses are used, a mismatch between the group velocities at the two interacting frequencies causes the pulses to separate in time ("pulse walkoff"), reducing their temporal overlap and hence lowering conversion efficiency [Reference 17]. Finally, pulse broadening due to group velocity dispersion (GVD) reduces conversion efficiency by reducing the peak power of the pulses.

Figure 7A:
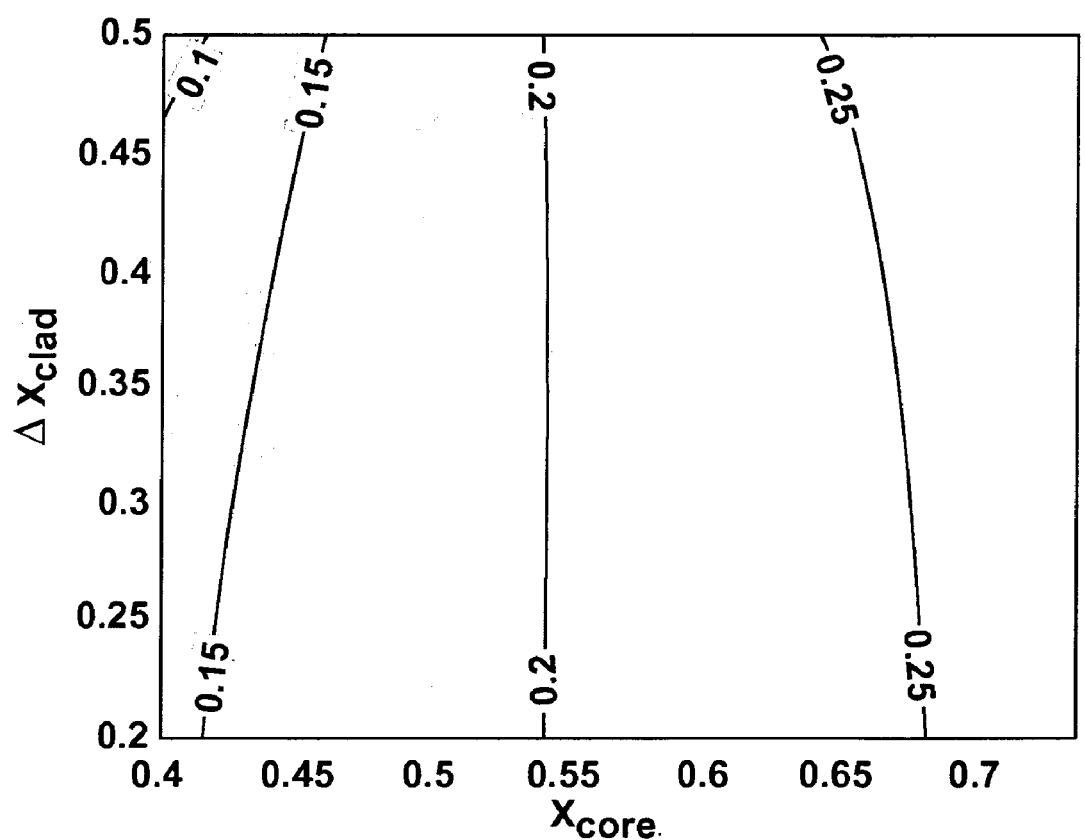
FIG. 7 illustrates (a) Spectral bandwidth (FWHM) for a 1 cm device length, over a range of $x_{core}$ and $\Delta x_{clad}$ ($x_{clad}$ symmetric about $x_{core}$), and (b) Spectral bandwidth (FWHM) for a 1 cm device length, over a range of $x_{core}$ and $x_1-x_{core}$ ($x_2=1$).
Figure 7:
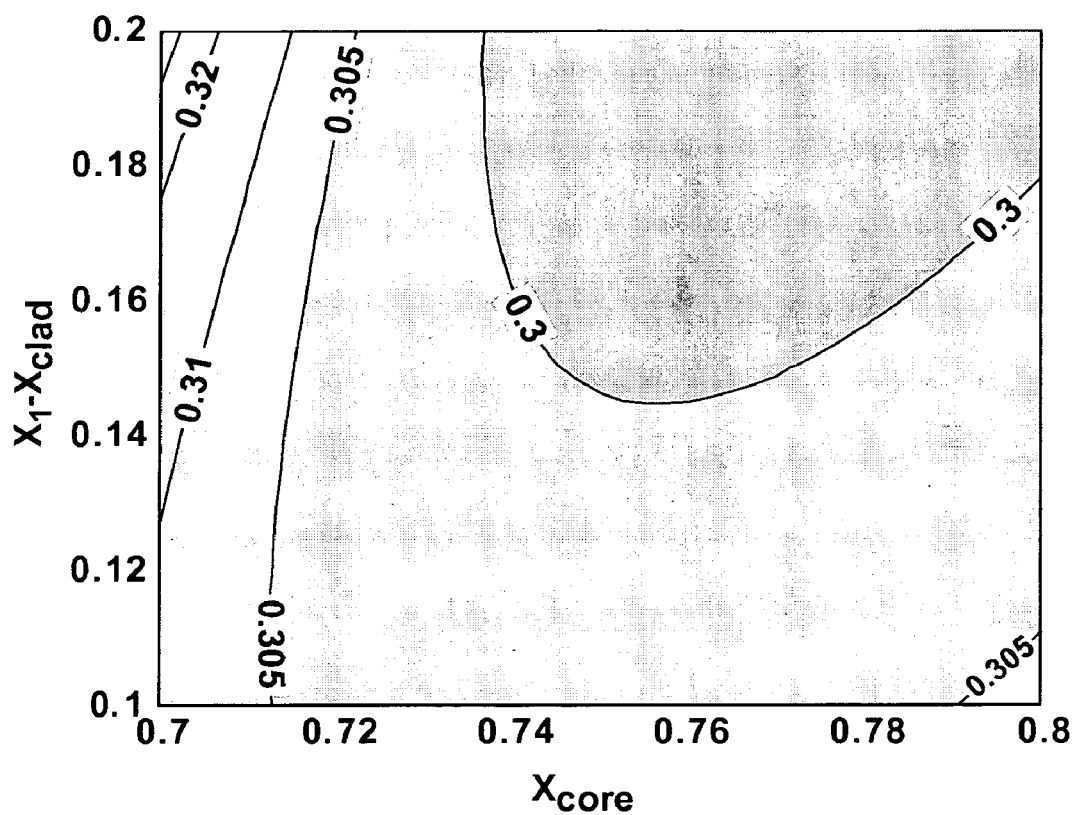

To estimate the spectral bandwidth of the structure, we adopt the criterion suggested by Fejer and co-workers [Reference 19]. For imperfect phase-matching over a device length L, SHG conversion efficiency varies as [sin (ΔL)/(ΔL)]², where 2Δ=β²ω−βω. This factor is reduced by 3 dB when ΔL=0.4429π, allowing us to define a full width at half maximum (FWHM) bandwidth around the fundamental wavelength for a nominally phase-matched structure with known length $L_D$:

$$\Delta \lambda_{FWHM} = \frac{0.4429\lambda}{L_D}\left(\left|\frac{\partial n_{eff}^\omega}{\partial \lambda} - \frac{1}{2}\frac{\partial n_{eff}^{2\omega}}{\partial \lambda}\right|\right)^{-1}, \quad (39)$$

where λ is the fundamental wavelength and the derivatives, which include both material and waveguide dispersion, are evaluated at their respective wavelengths. Here, dispersion terms higher than second order have been neglected. Contours of spectral bandwidth are shown in FIG. 7(a), for the waveguide structures shown in FIG. 5(a), and a device length of 1 cm. Bandwidth is seen to increase with $x_{core}$, which can be attributed to the reduction in material dispersion of AlGaAs as the bandgap energy moves away from the photon energy. In FIG. 7(b), bandwidth is shown for $x_2$=1.0, over a range of $x_{core}$ and ($x_1-x_{core}$). Bandwidth increases to about 0.34 nm at {$x_1$, $x_{core}$, $x_2$}={0.5, 0.7, 1.0}, until the parameter range becomes limited by the existence of phase-matched solutions to the mode dispersion equations, subject to (23). This bandwidth corresponds well with those measured by Rao and co-workers (0.5~1.0 nm over a 3 mm length) using modal phase-matching in AlGaAs, and with those calculated by Fejer and co-workers [Reference 19] (~3 nm over a 1 mm length) in PPLN.

Optical pulses travel with a group velocity $$v_g = \frac{\partial \omega}{\partial \beta} = c\left(n_{eff} - \lambda \frac{\partial n_{eff}}{\partial \lambda}\right)^{-1}, \quad (40)$$

which can be evaluated by implicitly differentiating the mode dispersion equation (15), $$v_g = -\left[\frac{\partial F}{\partial \beta}\right]_\omega \left[\frac{\partial F}{\partial \omega}\right]_\beta^{-1}. \quad (41)$$

The group velocity mismatch is equal to the difference between inverse group velocities, which in the case of nominal phase-matching becomes $$GVM = \left|\frac{1}{v_g^\omega} - \frac{1}{v_g^{2\omega}}\right| = \frac{\lambda}{c}\left|\left(\frac{\partial n_{eff}^\omega}{\partial \lambda} - \frac{1}{2}\frac{\partial n_{eff}^{2\omega}}{\partial \lambda}\right)\right|. \quad (42)$$

Figure 8:
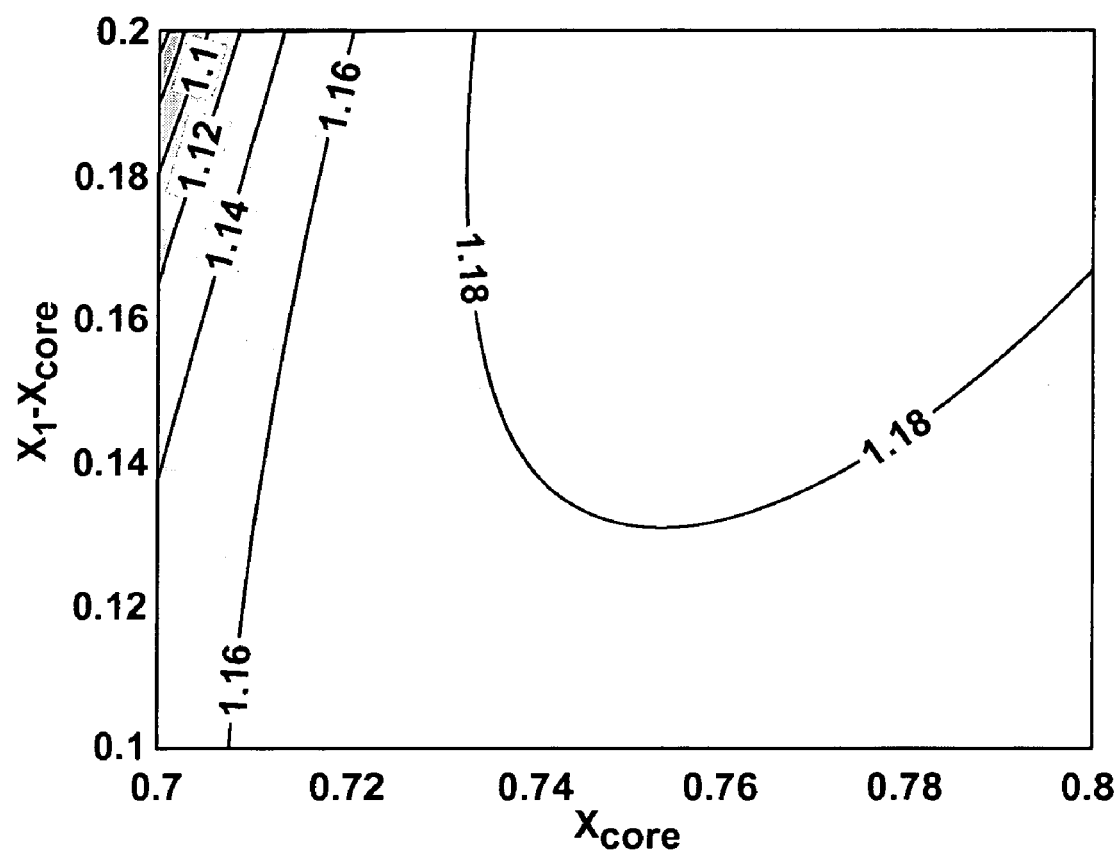
FIG. 8 illustrates group velocity mismatch (ps/mm) over a range of $x_{core}$ and $x_1-x_{core}$ ($x_2=1$).

Comparing (42) with (39), it is clear that spectral bandwidth and group velocity mismatch (GVM) are optimized simultaneously, as both require minimization of the difference in dispersion between the two modes. FIG. 8 shows GVM over the optimized parameter range used in FIG. 7(b). GVM decreases to a value of ≈1.05 ps/mm at {$x_1$, $x_{core}$, $x_2$}={0.5, 0.7, 1.0}. This GVM allows pulses at ω of width $\tau_0^{GVM}$>10 ps to propagate through a waveguide of 1 cm length without appreciable reduction in SHG efficiency due to pulse walkoff.

In order to enable phase-matching over larger bandwidths and for shorter pulses, hence higher peak intensities, optimization can be carried out; below specific embodiments of the waveguide of the present invention are discussed that further reduce GVM.

Figure 9:
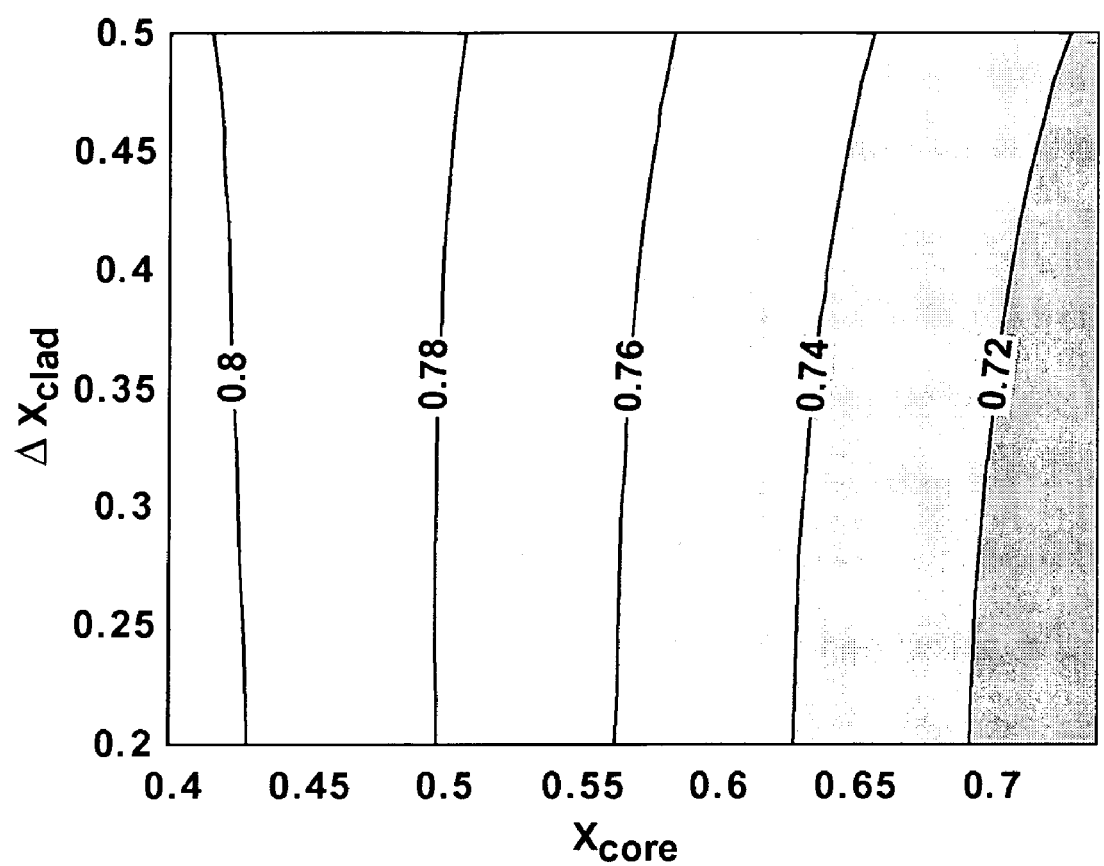
FIG. 9 illustrates group velocity dispersion $\partial^2\beta/\partial\omega^2$ (fs$^2$/$\mu$m) of (a) fundamental mode over a range of $x_{core}$ and $\Delta x_{clad}$ ($x_{clad}$ symmetric about $x_{core}$), (b) SH mode over a range of $x_{core}$ and $\Delta x_{clad}$, and (c) SH mode over a range of $x_{core}$ and $x_1-x_{core}$ ($x_2=1$).

Group velocity dispersion for a device length $L_D$ is quantified by a characteristic pulse width [17]

$$\tau_0^{GVD} = \sqrt{8L_D \frac{\partial^2 \beta}{\partial \omega^2}}, \quad (43)$$

below which the pulse will experience appreciable broadening. The term $\partial^2 \beta / \partial \omega^2$ can be evaluated by further differentiation of (41). FIG. 9(a) shows $\partial^2 \beta / \partial \omega^2$ (in units of fs²/μm) for the fundamental mode, for the range of parameters used in FIG. 5(a), and $L_D$=1 cm. The average value of 0.75 fs²/μm corresponds to $\tau_0^{GVD}$~250 fs, which is negligible in comparison $\tau_0^{GVM}$.

Figure 9B:
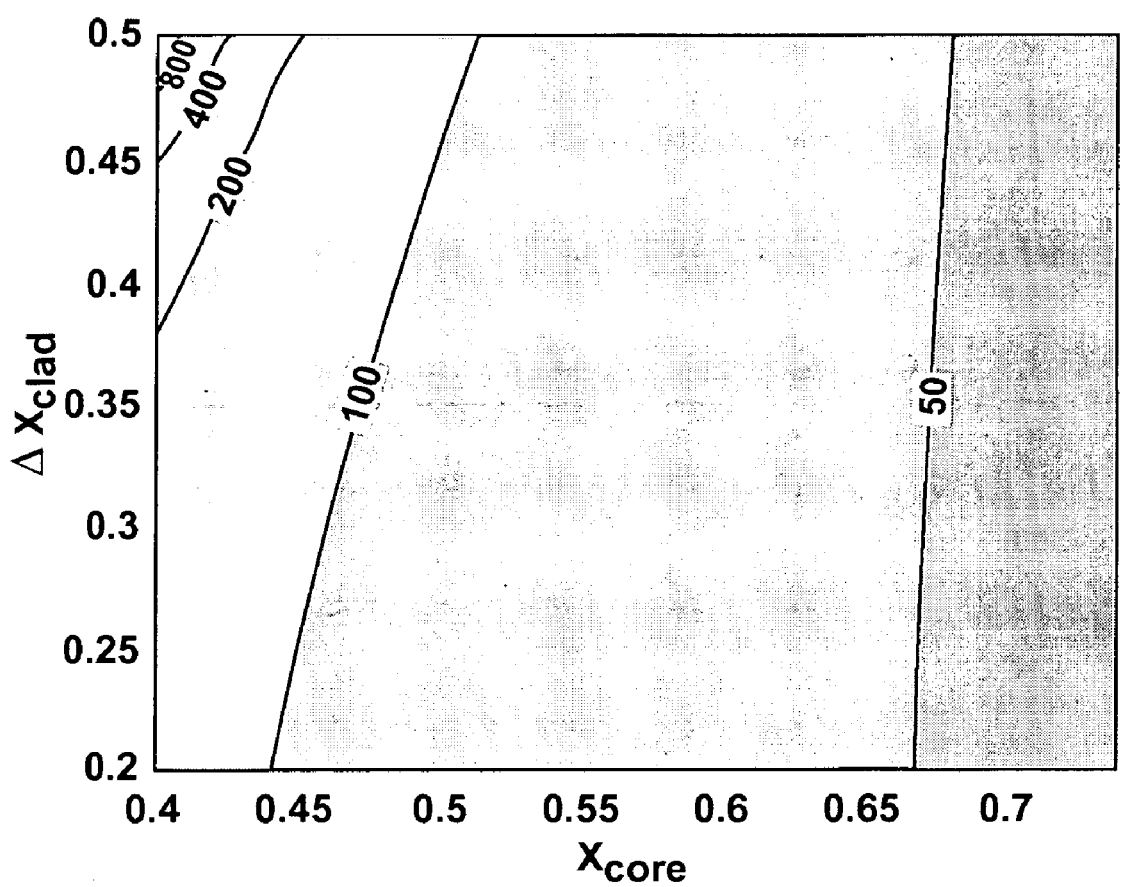
Figure 9C:
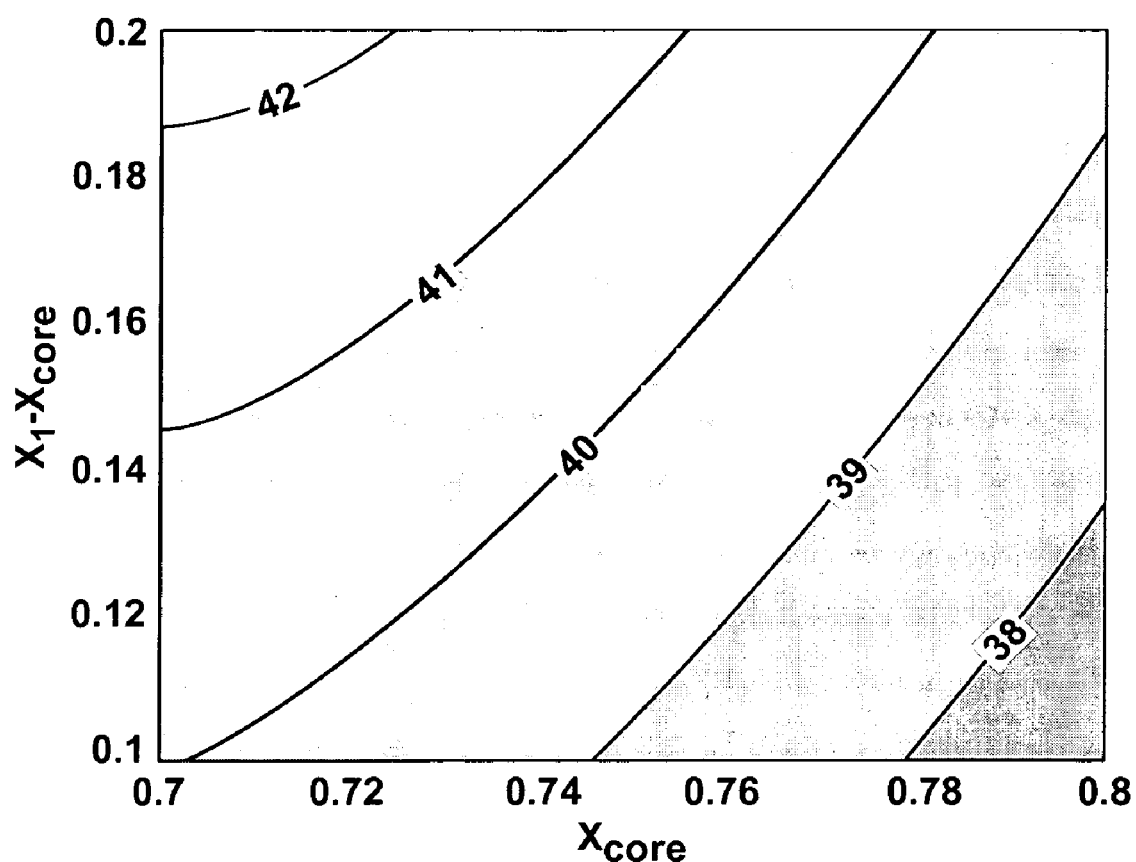

GVD at the SH wavelength is shown in FIG. 9(b). Values of several hundred fs²/μm are found, as can be expected for a resonant device operating in the middle of the stop-band. FIG. 9(c) shows GVD for $x_2$=1.0, over a range of $x_{core}$ and ($x_1-x_{core}$), which decreases with the index difference in the cladding (weak resonance). A GVD of 40 fs²/μm in this region corresponds to $\tau_0^{GVD}$<2 ps over 1 cm, again small in comparison to $\tau_0^{GVM}$. Thus, a tradeoff exists between GVD and SHG conversion efficiency, which requires large index difference in the cladding (minimization of propagation loss also requires a large index difference, as will be demonstrated in the following subsection). From these calculations, it can be seen that pulses of duration greater than 10 ps can be phase-matched over a distance of 1 cm without appreciable reduction in SH generation efficiency.

C. Propagation Loss

The preceding illustrations of the waveguide of the present invention assume that the cladding consists of an infinite number of periods, such that the propagation loss due to leakage out of the waveguide is zero. In the preferred embodiment of the waveguide of the present invention, however, there is preferably a finite number of cladding periods. The leakage in such devices can be estimated using a ray-optics approach [as in Reference 20]. We assume that the loss is low enough that the propagation constant β is essentially real, and that there is negligible perturbation to the unit cell translation matrix formulation described above.

In the ray-optics picture, the angle of incidence between core and cladding is given by $$\theta_i = \sin^{-1}\left(\frac{n_{eff}}{n_{core}}\right), \quad (44)$$

and the number of reflections per unit length is $1/(t_c \tan \theta_i)$. The reflection coefficient at the interface between the core and finite cladding can be calculated using the transfer matrix formalism of Chilwell and Hodgkinson [Reference 15]. Here, the field amplitudes in the $j^{th}$ layer are represented by a matrix $$M_j = \begin{pmatrix} \cos\Phi_j & \frac{-i}{\gamma_j}\sin\Phi_j \\ -i\gamma_j\sin\Phi_j & \cos\Phi_j \end{pmatrix}, \text{ where} \quad (45)$$

$$\gamma_j = \frac{1}{(n_j)^{2\rho}}\sqrt{n_j^2 - n_{eff}^2}, \rho = \begin{cases} 0 (TE) \\ 1 (TM) \end{cases}, \text{ and} \quad (46)$$

$$\Phi_j = k_j t_j \quad (47)$$

($t_j$=a, b) is the phase thickness of the layer. The transfer matrix for a stack of films is given by the product of these matrices, $$M = \prod_{j=1}^{J} M_j. \quad (48)$$

Thus, the cladding of an N-period BRW has transfer matrix $$M_{clad} = (M_1 M_2)^N \quad (49)$$

$$= \begin{pmatrix} \cos\Phi_1\cos\Phi_2 - \left(\frac{\gamma_2}{\gamma_1}\right)\sin\Phi_1\sin\Phi_2 & -i\left(\frac{1}{\gamma_1}\sin\Phi_1\cos\Phi_2 + \frac{1}{\gamma_2}\cos\Phi_1\sin\Phi_2\right) \\ -i\begin{pmatrix}\gamma_1\sin\Phi_1\cos\Phi_2 + \\ \gamma_1\cos\Phi_1\sin\Phi_2\end{pmatrix} & \cos\Phi_1\cos\Phi_2 - \left(\frac{\gamma_1}{\gamma_2}\right)\sin\Phi_1\sin\Phi_2 \end{pmatrix}^N$$

$$\equiv \begin{pmatrix} m_{11}^N & m_{12}^N \\ m_{21}^N & m_{22}^N \end{pmatrix}.$$

For the QW-BRW, $\Phi_j = \pi/2$, and (49) reduces to $$M^{\lambda/4} = (-1)^N \begin{pmatrix} \left(\frac{\gamma_2}{\gamma_1}\right)^N & 0 \\ 0 & \left(\frac{\gamma_1}{\gamma_2}\right)^N \end{pmatrix}. \quad (50)$$

In the general case, the unimodularity of $M_1 M_2$ can be exploited to calculate (49) using the Chebyshev identity [21]

$$\begin{pmatrix} m_{11} & m_{12} \\ m_{21} & m_{22} \end{pmatrix}^N = \begin{pmatrix} m_{11}U_{N-1} - U_{N-2} & m_{12}U_{N-1} \\ m_{21}U_{N-1} & m_{22}U_{N-1} - U_{N-2} \end{pmatrix}, \quad (51)$$

where $$U_N = \frac{\sin(N+1)\zeta}{\sin\zeta}, \quad (52)$$

$$\zeta = \cos^{-1}\left[\frac{m_{11}+m_{22}}{2}\right]. \quad (53)$$

The reflection coefficient can then be calculated from the transfer matrix [15] as $$r = \frac{\gamma_c m_{11}^N + \gamma_c \gamma_s m_{12}^N - m_{21}^N - \gamma_s m_{22}^N}{\gamma_c m_{11}^N + \gamma_c \gamma_s m_{12}^N + m_{21}^N + \gamma_s m_{22}^N}, \quad (54)$$

where $\gamma_c$ and $\gamma_s$ are defined analogously to (46) for the core and substrate. For the QW-BRW, from (50), $$r = \frac{\gamma_c\left(\frac{\gamma_2}{\gamma_1}\right)^N - \gamma_s\left(\frac{\gamma_1}{\gamma_2}\right)^N}{\gamma_c\left(\frac{\gamma_2}{\gamma_1}\right)^N + \gamma_s\left(\frac{\gamma_1}{\gamma_2}\right)^N}. \quad (55)$$

As $\gamma_1 > \gamma_2$, $\lim_{N\to\infty} r = -1$, as noted above.

The power remaining after each reflection is $|r|^2$. We can now calculate the propagation loss using (44)-(55):

$$\text{Loss[dB/cm]} = \frac{-\ln(|r|)}{5 t_c \tan\theta_i}. \quad (56)$$

Figure 10:
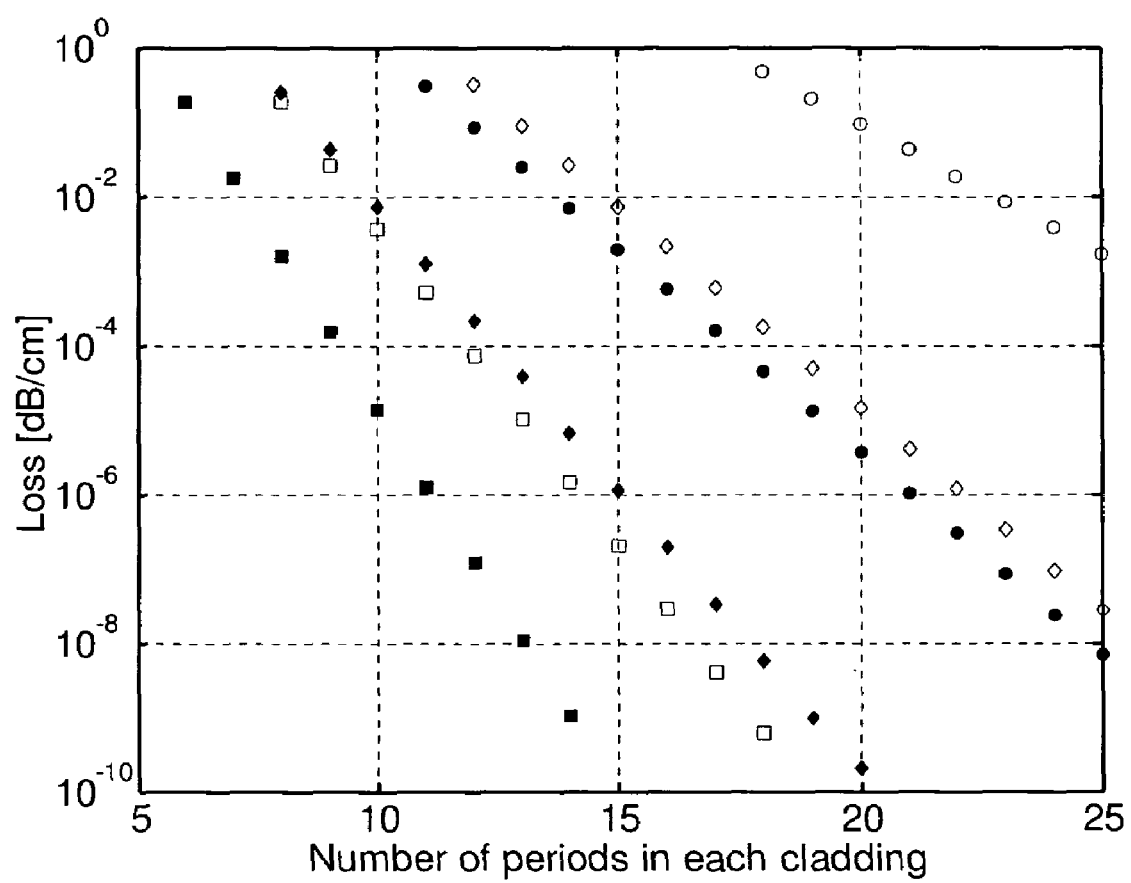
FIG. 10 illustrates propagation loss as a function of the number of cladding periods [filled markers indicate BRW mode and hollow markers indicate TIR mode; $x_{core}=0.5$, $\Delta x_{clad}=0.3$ (○), 0.4 (◇), 0.5 (□)].

Plots of propagation loss vs. N for various values of $\Delta x_{clad}$ are shown in FIG. 10. As expected, loss decreases exponentially with N, and is lower for larger $\Delta x_{clad}$. It can be seen that for a few periods, propagation loss due to leakage is negligible in comparison to the expected scattering losses. Therefore, it can be seen that for the quarter-wave case whilst working in the middle of the Bragg bandgap, it is acceptable to use the theory of infinite cladding layers to approximate a finite cladding.

Phase-Matching Tunability

Under this heading the wavelength tuning properties of the waveguide of the present invention are described.

Many of the applications that rely on second order nonlinearities also depend on the capability of tuning the nonlinearity, and hence the phase-matching, for them to be useful. Examples include tunable difference frequency generation for optical communications, tunable OPOs and tunable intensity dependent switches that rely on cascaded second order nonlinearities. Temperature and angle tuning have been the two most popular tuning methods for the PPLN technology. Angle tuning is not applicable to guided wave devices and was only useful for collimated beam configurations such as with PPLN. While temperature tuning is applicable for devices such as those studied here, the technique suffers from numerous unattractive features which make it undesirable. Performance stability, repeatability, thermal time constants and setup complexity are some of these drawbacks. In the interest integration of the waveguide of the present invention with semiconductors generally, it is advantageous to make use of the various tuning methods offered by these materials. Techniques such as electro-optic and carrier induced tuning lend themselves to robust, low power and high precision tuning in integrated photonic device environments.

Tuning the modes of BRWs to remain phase-matched with TIR modes is not straightforward, as a significant perturbation of the cladding generally causes a deviation from the quarter-wave condition, and may in fact shift the BRW mode entirely out of the stop-band, increasing mode loss. One of the most promising means of tuning such structures is to restrict the refractive index change to the core layer. This is because such effects will be similar to tuning the material thickness and hence will have minimal effect on the other waveguiding properties as well as provide continuous tuning. The examples below intend to provide an order-of-magnitude estimate of the tuning range of the waveguide of the present invention. In addition to the following examples, it should be understood that phase-match tuning can also be achieved by altering temperature (i.e. temperature tuning).

A. Carrier Tuning

Carrier tuning relies on the dependence of the semiconductor refractive index on the concentration of free carriers. The most common route to controlling the carrier concentration is through current injection. A doped structure with a p-i-n doping profile, where the intrinsic region is the volume that needs to be tuned, is usually used for this purpose. As the structure is put in forward bias, current flows across the depletion region which coincides primarily with the intrinsic region. The technique has been used to tune filters [Reference 22] and tunable lasers [Reference 23]. In the waveguide structure described herein, if the upper and lower cladding regions are p- and n-doped, respectively, an appreciable carrier density in the core will change the core index, thus shifting the effective index of both the BRW and TIR modes, and altering the phase-matching wavelength.

Figure 11:
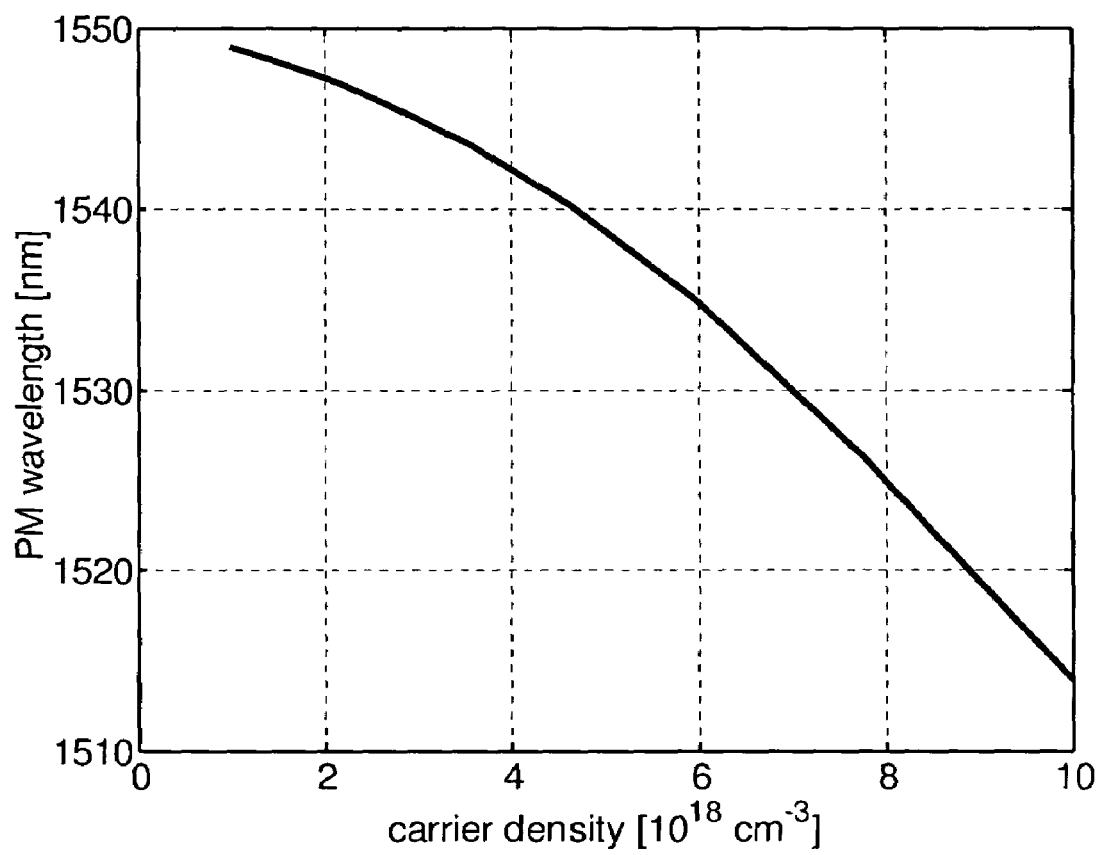
FIG. 11 illustrates an example of carrier tuning, namely phase-matching wavelength vs. carrier density.

The effect of a given carrier concentration on the refractive index of GaAs has been studied by numerous authors [e.g., Reference 24, 25]. A full model calculates the spectral shift of absorption due to bandfilling (Burstein-Moss effect), bandgap shrinkage, and free-carrier absorption (plasma effect), with subsequent evaluation of the index shift by Kramers-Kronig analysis [Reference 26], and shows a roughly linear decrease of n with carrier density N for $N>10^{18}$ cm$^{-3}$, with $dn/dN \approx -10^{-20}$ cm$^3$ [Reference 24]. In this way, index changes up to $-0.1$ can be readily achieved. In FIG. 11, the phase-matching fundamental wavelength is shown over a range of carrier concentrations, for a waveguide with $\{x_1, x_{core}, x_2\} = \{0.3, 0.5, 0.7\}$. Wavelength tunability over several tens of nm can be accomplished using carrier densities of $10^{19}$ cm$^{-3}$, which is not uncommon to achieve in active photonic devices. This tuning range will ultimately be limited by the increased absorption of the tuned SH mode as it approaches the core bandgap. However, the effects of the excess free carrier absorption are not included here.

B. Electro-Optic Tuning

Unlike carrier tuning, which takes place in a forward biased pn junction, electro-optic (EO) tuning takes place in a reverse biased pn junction. In III-V semiconductors, the electro-optic effects available include linear EO, quadratic EO, Franz-Keldysh, or—if quantum wells are present—quantum confined Stark effects [Reference 27, 28]. For simplicity and in order to demonstrate the principle, the illustration of the present invention is limited to linear electro-optic effect. As with carrier tuning, the waveguide of the present invention is provided, in a particular embodiment thereof, with a p-i-n structure, where the intrinsic region is the waveguide core. Thus, in reverse bias the electric field will fall chiefly across the core (we assume here that the widening of the depletion layer with reverse bias is negligible).

Figure 12:
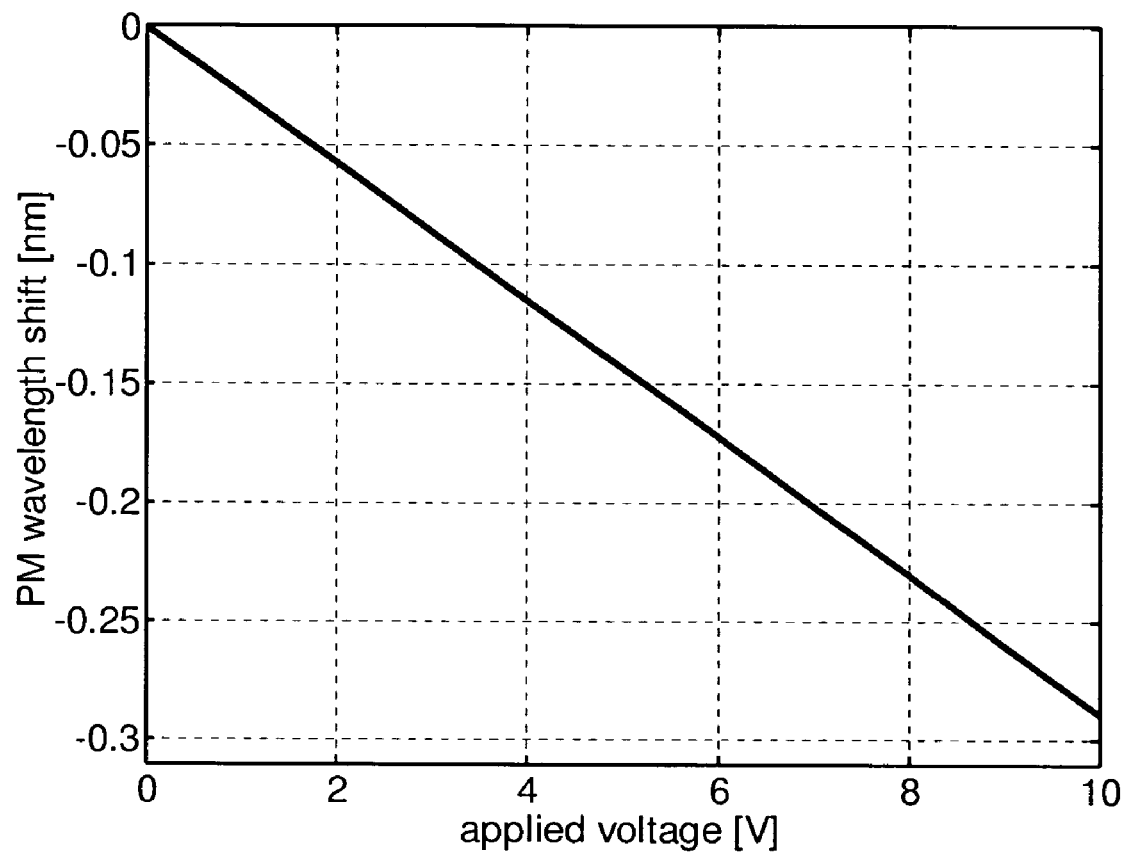
FIG. 12 illustrates an example of linear electro-optic tuning: phase-matching wavelength shift vs. applied voltage.

The change in refractive index with applied field E is given by $$\Delta n_{core} = \frac{1}{2} r n_{core,0}^3 E, \quad (57)$$

where $n_{core,0}$ is the core index with no applied field, and r is the linear electro-optic coefficient appropriate to the crystal orientation and field polarization. Extrapolating data from [29], we use $r = -1.5$ pm/V at 1550 nm and $-1.9$ pm/V at 775 nm. The applied field must be less than the dielectric breakdown field, which is around 300 kV/cm. From (57), the largest index difference achievable using the linear EO effect is $\Delta_{core} \approx 0.001$. FIG. 12 shows a tuning curve for a waveguide with $\{x_1, x_{core}, x_2\} = \{0.3, 0.5, 0.7\}$, with the shift in fundamental phase-matching wavelength with applied voltage shown, due to the small tuning range achieved. The tuning slope is approximately $-29$ pm/V, with a maximum wavelength tuning of $-0.29$ nm at 10 V (which is close to the breakdown voltage for this structure). This fine-tuning of the phase-matching wavelength can be used to compensate for drift in the pump wavelength.

Advanced Implementations of the Waveguide

The advanced implementation given here is not a part of the invention as it was first proposed in Reference 1, however it helps further clarify the invention. Under this heading, specific attributes of advanced implementations of the waveguide of the present invention are described.

By using advanced optimization techniques, performance of the BRW/TIR phase-matched waveguide of the present invention can be further improved. Evolutionary algorithms can be applied to seek out globally optimal waveguide designs depending on the particular device application.

Figure 13:
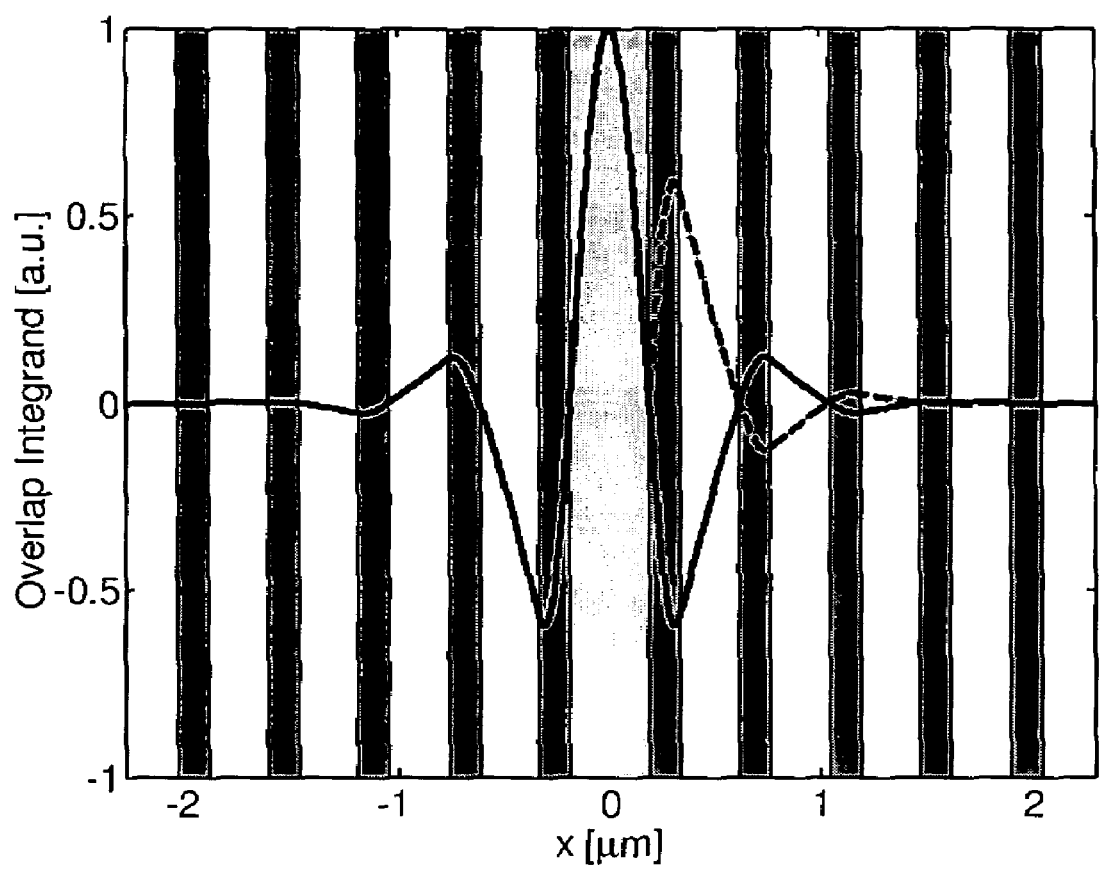
FIG. 13 illustrates the integrand of the numerator of equation (34), showing the effect of domain reversal in the cladding, in which the solid line shows no domain reversal, and the dashed line shows domain reversed in top cladding ($x>t_c/2$).
Figure 14:
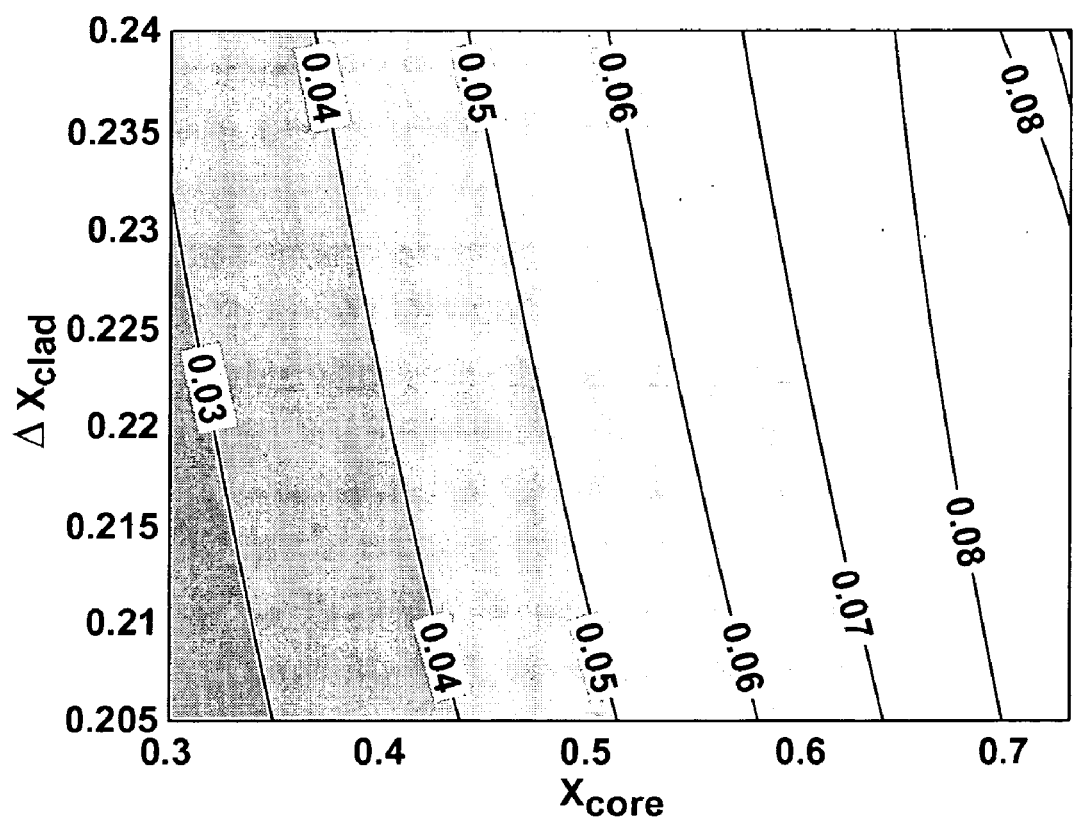
FIG. 14 illustrates $(n_{eff})^{-3}(t_{eff})^{-1}$ [$\mu m^{-1}$] over the range of waveguide designs used in FIG. 6(b), with one cladding domain inverted.

Many of the waveguide properties can be improved upon by deviating from the particular structure shown in FIG. 2. The SHG conversion efficiency of this device is limited by the oscillatory behavior of the BRW mode, as seen in FIG. 3. By (13), it is clear that in evaluating the contribution to effective thickness from cladding period n, $$\left| \int_{n=2q} [E^{2\omega}(x)]^* d'(x) [E^\omega(x)]^2 \, dx \right| > \tag{58}$$

$$\left| \int_{n=2q+1} [E^{2\omega}(x)]^* d'(x) [E^\omega(x)]^2 \, dx \right|, \, (q = 0, 1, \ldots ),$$

and therefore each pair of cladding periods contributes $$\sum_{n=2q}^{2q+1} \int_n [E^{2\omega}(x)]^* d'(x) [E^\omega(x)]^2 \, dx < 0 \tag{59}$$

with respect to the contribution of the core. This problem has been overcome by various authors in $TE_0^{\omega}\text{-}TE_2^{2\omega}$ modal dispersion phase-matching by using rotationally twinned domains to reverse the sign of d' at the points where the $TE_2^{2\omega}$ mode changes sign [16]. While domain reversal in GaAs/AlGaAs has been achieved, it has been applied only as a single reversal, patterned in the direction of propagation, to achieve quasi-phase-matching. Reversing the domain between every cladding period would be technologically unfeasible, and would create problems for current injection into the core. However, a single domain reversal at one core/cladding interface is possible, and would allow the contributions of each cladding to cancel out. The integrand of the numerator of (34) is plotted in FIG. 13 to illustrate this point. In this case, the problem is reduced to maximizing the overlap of both modes with the core. FIG. 14 shows η for this case, using the same waveguide indices as in 6(b). The efficiency is seen to improve by a factor of 1.5 to 2 over this range. It should be noted that inverting one cladding destroys the symmetry of the induced polarization at 2ω, allowing for coupling to odd BRW modes, which are lossy and not phase-matched to the fundamental.

To avoid the necessity of domain inversion, the index profile of the cladding may be modified in a number of ways. Specifically, the use of a multi-layer cladding period is expected to improve spatial overlap of the modes while tailoring the dispersion to improve the spectral properties of the waveguide. However, this requires substantial alteration to the unit cell translation matrix described above.

Finally, it is possible to allow the thicknesses and compositions of each layer to become degrees of design freedom, subject to the constraint that the fundamental and SH modes experience TIR and Bragg waveguiding (although not necessarily at the quarter-wave condition), respectively. In this case, any number of waveguide properties can be simultaneously optimized. To this end, optimization methods such as the genetic algorithm have been successfully applied to design problems involving stacks of thin films [Reference 30, 31].

Therefore in accordance with the present invention a method is described for providing phase-matching for second harmonic generation within a waveguide. The waveguide of the present invention operates via total internal reflection at the fundamental wavelength and by transverse Bragg reflection at the second harmonic wavelength. The Bragg waveguide is capable of guiding modes with effective indices lower than the material indices, making it an excellent choice to compensate for the large dispersion of semiconductors near their electronic resonances, where nonlinear effects are enhanced. By forcing the BRW to operate in the center of the stop-band, the waveguide of the present invention is operable to provide phase-matching core thickness for arbitrary core and cladding materials.

The examples of the waveguide of the present invention presented above illustrated that the waveguide properties compare favorably with other known solutions for phase-matching, and as such, however, the present invention provides a more efficient solutions; particularly implemented as monolithically integrated nonlinear elements in semiconductors. In particular, the waveguide of the present invention can be integrated monolithically with lasers and cavities for enhanced integration density.

It will be appreciated by those skilled in the art that other variations of the preferred embodiment may also be practiced without departing from the scope of the invention.

LIST OF REFERENCES

[1] Brian R. West, A. S. Helmy, "Exact Phase-matching using Bragg Reflection Waveguides," *IEEE J. of Select. Topics in Quantum Electronics*, vol. 12, 431-446 (2006)

[2] A. S. Helmy, "Phase-matching using Bragg reflection waveguides for monolithic non-linear applications," *Optics Express.*, vol. 14, P 1243-1252 (2006)

[3] P. Yeh and A. Yariv, "Bragg reflection waveguides," *Opt. Comm.*, vol. 19, no. 3, pp. 427-430, December 1976, and references within.

[4] P. Yeh, A. Yariv, and C.-S. Hong, "Electromagnetic propagation in periodic stratified media: I. General Theory," *JOSA*, vol. 67, no. 4, pp. 428-438, April 1977, and references within.

[5] Y. Sakurai and F. Koyama, "Proposal of tunable hollow waveguide distributed Bragg reflectors," *Jap. J. Appl. Phys.*, vol. 43, no. 5A, pp. L631-L633, 2004.

[6] A. Mizrahi and L. Schachter, "Optical Bragg accelerators," *Phys. Rev. E*, vol. 70, Art. 016505(2), July 2004.

[7] E. Simova and I. Golub, "Polarization splitter/combiner in high index contrast Bragg reflector waveguides," *Opt. Express*, vol. 11, no. 25, pp. 3425-3430, December 2003.

[8] C. Wächter, F. Lederer, L. Leine, U. Trutschel, and M. Mann, "Nonlinear Bragg reflection waveguide," *J. Appl. Phys.*, vol. 71, no. 8, pp. 3688-3692, April 1992.

[9] P. M. Lambkin and K. A. Shore, "Nonlinear semiconductor Bragg reflection waveguide structures," *IEEE J. Quantum Electron.*, vol. 27, no. 3, pp. 824-829, March 1991.

[10] P. Yeh, *Optical Waves in Layered Media*, New York: Wiley-Interscience, 2005.

[11] S. G. Johnson, M. Ibanescu, M. Skorobogatiy, O. Weisberg, T. D. Engeness, M. Soljačić, S. A. Jacobs, J. D. Joannopoulos, and Y. Fink, "Low-loss asymptotically single-mode propagation in large-core OmniGuide fibers," *Opt. Express*, vol. 9, no. 13, pp. 748-779, December 2001.

[12] S. Esposito, "Universal photonic tunneling time," *Phys. Rev. E*, vol. 64, Art. 026609, 2001.

[13] J. S. Aitchison, D. C. Hutchings, J. U. Kang, G. I. Stegeman, and A. Villeneuve, "The nonlinear optical properties of AlGaAs at the half band gap," *IEEE J. Quantum Electron.*, vol. 33, no. 3, pp. 341-348, March 1997.

[14] S. Adachi, "GaAs, AlAs, and $Al_xGa_{1-x}As$ material parameters for use in research and device applications," *J. Appl. Phys.*, vol. 58, no. 3, pp. R1-R29, August 1985.

[15] J. Chilwell and I. Hodgkinson, "Thin-films field-transfer matrix theory of planar multilayer waveguides and reflection from prism-loaded waveguides," *JOSA A*, vol. 1, no. 7, pp. 742-753, July 1984.

[16] J. Khurgin, "Improvement of frequency-conversion efficiency in waveguides with rotationally twinned layers," *Opt. Lett.*, vol. 13, no. 7, pp. 603-605, July 1988.

[17] T. Suhara and M. Fujimura, *Waveguide Nonlinear-Optic Devices*, Berlin: Springer, 2003.

[18] C. N. Ironside, J. S. Aitchison, and J. M. Arnold, "An all-optical switch employing the cascaded second-order nonlinear effect," *IEEE J. Quantum Electron.*, vol. 29, no. 10, pp. 2650-2654, October 1993.

[19] M. M. Fejer, G. A. Magel, D. H. Jundt, and R. L. Byer, "Quasi-phase-matched second harmonic generation: tuning and tolerances," *IEEE J. Quantum Electron.*, vol. 28, no. 11, pp. 2631-2654, November 1992.

[20] A. Argyros, "Guided modes and loss in Bragg fibres," *Opt. Express*, vol. 10, no. 24, pp. 1411-1417, December 2002.

[21] M. Born and E. Wolf, *Principles of Optics: Electromagnetic Theory of Propagation, Interference, and Diffraction of Light*, $6^{th}$ ed., New York: Pergamon Press, 1980.

[22] J.-P. Weber, "Optimization of the carrier-induced effective index change in InGaAsP waveguides—application to tunable Bragg filters," *IEEE J. Quantum Electron.*, vol. 30, no, 8, pp. 1801-1816, August 1994.

[23] G. M. Smith, J. S. Hughes, R. M. Lammert, M. L. Osowski, and J. J. Coleman, "Wavelength tunable 2-pad ridge-wave-guide distributed-Bragg-reflector InGaAs-GaAs quantum-well lasers," *Electron. Lett.*, vol. 30, no. 16, pp. 1313-1314, August 1994.

[24] J. G. Mendoza-Alvarez, F. D. Nunes, and N. B. Patel, "Refractive index dependence on free carriers for GaAs," *J. Appl. Phys.*, vol. 51, no. 8, pp. 4365-4367, August 1980.

[25] H. C. Huang and S. Yee, "Change in refractive index for p-type GaAs at $\lambda$=1.06, 1.3, and 1.55 µm due to free carriers," *J. Appl. Phys.*, vol. 70, no. 2, pp. 925-929, July 1991.

[26] B. R. Bennett, R. A. Soref, and J. A. Del Alamo, "Carrier-induced change in refractive index of InP, GaAs, and InGaAsP," *IEEE J. Quantum Electron.*, vol. 26, no. 1, pp. 113-122, January 1990.

[27] N. Peyghambarian, S. W. Koch, and A. Mysyrowicz, *Introduction to Semiconductor Optics*, New York: Prentice Hall, 1993.

[28] T. H. Wood, R. W. Tkach, and A. R. Chraplyvy, "Observation of large quadratic electro-optic effect in GaAs/AlGaAs multiple quantum wells," *Appl. Phys. Lett.*, vol. 50, no. 13, pp. 798-800, March 1987.

[29] C.-A. Berseth, C. Wuethrich, and F. K. Reinhart, "The electro-optic coefficients of GaAs: Measurements at 1.32 and 1.52 µm and study of their dispersion between 0.9 and 10 µm," *J. Appl. Phys.*, vol. 71, no. 6, pp. 2821-2825, March 1992.

[30] J.-M. Yang and C.-Y. Kao, "An evolutionary algorithm for the synthesis of multilayer coatings at oblique light incidence," *J. Lightwave Technol.*, vol. 19, no. 4, pp. 559-570, April 2001.

[31] S. Martin, J. Rivory, and M. Schoenauer, "Synthesis of optical multilayer systems using genetic algorithms," *Appl. Opt.*, vol. 34, no. 13, pp. 2247-2254 May 1995.

What is claimed is:

1. An apparatus for achieving phase-matching using a waveguide having material independence, the apparatus comprising:
   (a) a core of adjustable thickness operable to produce an arbitrary effective index; and
   (b) upper cladding and lower cladding having a periodic structure, the upper cladding and the lower cladding connected adjacent to and oppositely disposed about the core to guide a fundamental wavelength by the total internal reflection and guide a second harmonic wavelength by the transverse Bragg reflection;
   wherein the core, the upper cladding and the lower cladding are operable to guide waves by total internal reflection and by transverse Bragg reflection and one or more phase-matching tunability methods are applied in relation to wavelengths and different tunability methods may be applied to individual wavelengths within the apparatus.

2. The apparatus of claim 1 wherein a fundamental wavelength is guided by the total internal reflection and a second harmonic wavelength is guided by the transverse Bragg reflection.

3. The apparatus of claim 2 wherein the second harmonic wavelength has a transverse wavevector associated with it, and the wavevector lies within a Bragg stop-band, said stop-band being any region of a spectrum where top and/or bottom Bragg stacks of the waveguide reflect radiation back into the core of the waveguide.

4. The apparatus of claim 1 wherein there is no material perturbation along propagation direction of the waves, whereby the direction of propagation for the waves is constant.

5. The apparatus of claim 1 wherein electrical conductivity is possible in the directions orthogonal to and parallel to the propagation direction of the waves.

6. The apparatus of claim 1 wherein the core, the upper cladding and the lower cladding are further operable to guide a plurality of modes with effective indices lower than a plurality of material indices.

7. The apparatus of claim 1 wherein gain of the waves is provided through carrier injection or optical injection.

8. The apparatus of claim 1 wherein the phase-matching tunability is achieved by applying voltage, carrier injection tuning, electro-optic tuning, and/or temperature tuning.

9. The apparatus of claim 1 wherein the core, the upper cladding and the lower cladding are monolithically integrated in semiconductors.

10. The apparatus of claim 9 wherein the core, the upper cladding and the lower cladding are selected from $GaAs/Al_xGa_{1-x}As$ material system.

11. The apparatus of claim 10 wherein the fundamental wavelength is 1550 nm and the second harmonic wavelength is 775 nm.

12. A method for phase-matching comprising:
   (a) directing waves through a waveguide having material independence and thereby achieving phase-matching;
   (b) guiding a fundamental wavelength by the total internal reflection and guiding a second harmonic wavelength by the transverse Bragg reflection; and
   (c) tuning modes of the waves to achieve tuning relating to individual wavelengths by way of one or more of the following:
      (i) carrier injection tuning;
      (ii) applying voltage;
      (iii) temperature tuning; and
      (iv) electro-optic tuning.

13. The method of claim 12 whereby the waveguide operates via total internal reflection and by transverse Bragg reflection.

14. The method of claim 13 whereby a fundamental wavelength is guided by the total internal reflection and a second harmonic wavelength is guided by the transverse Bragg reflection.

15. The method of claim 14 wherein the second harmonic wavelength has a transverse wavevector associated with it, and the wavevector lies within with a Bragg stop-band.

16. The method of claim 12 wherein the waveguide comprises a core, upper cladding and lower cladding.

17. The method of claim 16 whereby the core, the upper cladding and the lower cladding is operable to guide modes with effective indices lower than material indices.

18. A method for achieving phase-matching using a waveguide having material independence, the method comprising:
(a) providing a waveguide that includes an adjustable core, upper cladding and lower cladding, wherein the upper cladding and the lower cladding have a periodic structure, wherein the materials and dimensions for the upper cladding, lower cladding and the core provide phase-matching, and wherein the upper cladding and the lower cladding adjacent to and oppositely disposed about the core are connected;
(b) directing waves through the core, whereby the core, the upper cladding and the lower cladding are operable to guide waves of a fundamental wavelength by total internal reflection and guide waves of a second harmonic wavelengths by transverse Bragg reflection; and
(c) tuning modes of the waves to achieve tuning relating to individual wavelengths.

19. The method of claim 18 whereby a fundamental wavelength is guided by the total internal reflection and a second harmonic wavelength is guided by the transverse Bragg reflection.

20. The method of claim 18 further comprising providing gain of the waves through carrier injection or optical injection.

21. The method of claim 18 further comprising tuning by applying voltage, carrier injection tuning, electro-optic tuning, and/r temperature tuning.

* * * * *